(12) United States Patent
Tai et al.

(10) Patent No.: US 12,362,274 B2
(45) Date of Patent: Jul. 15, 2025

(54) PACKAGE STRUCTURE AND METHOD OF FORMING THE SAME

(71) Applicant: Taiwan Semiconductor Manufacturing Company, Ltd., Hsinchu (TW)

(72) Inventors: Chih-Hsuan Tai, Taipei (TW); Hao-Yi Tsai, Hsinchu (TW); Tsung-Hsien Chiang, Hsinchu (TW); Yu-Chih Huang, Hsinchu (TW); Chia-Hung Liu, Hsinchu (TW); Ban-Li Wu, Hsinchu (TW); Ying-Cheng Tseng, Tainan (TW); Po-Chun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/582,494

(22) Filed: Feb. 20, 2024

(65) Prior Publication Data

US 2024/0194591 A1 Jun. 13, 2024

Related U.S. Application Data

(63) Continuation of application No. 17/315,365, filed on May 10, 2021, now Pat. No. 11,929,318, which is a
(Continued)

(51) Int. Cl.
*H01L 23/498* (2006.01)
*H01L 21/56* (2006.01)
(Continued)

(52) U.S. Cl.
CPC .......... *H01L 23/5226* (2013.01); *H01L 21/56* (2013.01); *H01L 21/76898* (2013.01);
(Continued)

(58) Field of Classification Search
CPC ............... H01L 23/5226; H01L 23/481; H01L 23/49827; H01L 23/34
See application file for complete search history.

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

CN 106941083 A * 7/2017 ............ H01L 21/56
DE 112018004499 T5 * 6/2020 ......... H01L 21/4846
(Continued)

*Primary Examiner* — Michele Fan
(74) *Attorney, Agent, or Firm* — JCIPRNET

(57) ABSTRACT

A package structure includes a thermal dissipation structure including a substrate, a first encapsulant laterally covering the substrate, a die disposed on the substrate and including a sensing region, a second encapsulant laterally covering the die, and a redistribution structure disposed on the die and the second encapsulant. An outer sidewall of the second encapsulant is laterally offset from an outer sidewall of the first encapsulant. The die is electrically coupled to the substrate through the redistribution structure, and the redistribution structure includes a hollow region overlying the sensing region of the die.

20 Claims, 29 Drawing Sheets

Related U.S. Application Data continuation of application No. 16/354,173, filed on Mar. 15, 2019, now Pat. No. 11,004,786.

(51) Int. Cl.
*H01L 21/768* (2006.01)
*H01L 23/00* (2006.01)
*H01L 23/31* (2006.01)
*H01L 23/367* (2006.01)
*H01L 23/48* (2006.01)
*H01L 23/522* (2006.01)
*H01L 23/528* (2006.01)

(52) U.S. Cl.
CPC ...... *H01L 23/3171* (2013.01); *H01L 23/3675* (2013.01); *H01L 23/481* (2013.01); *H01L 23/5283* (2013.01); *H01L 24/09* (2013.01); *H01L 24/17* (2013.01); *H01L 24/33* (2013.01); *H01L 24/73* (2013.01); *H01L 2224/0231* (2013.01); *H01L 2224/02373* (2013.01); *H01L 2224/02379* (2013.01); *H01L 2224/02381* (2013.01); *H01L 2224/73204* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0168206 A1* | 7/2012 | Sekine ............. H01L 23/49877 174/266 |

FOREIGN PATENT DOCUMENTS

| | | | | |
|---|---|---|---|---|
| JP | 2008002953 A | * | 1/2008 | ........... B81B 7/0064 |
| JP | 4766087 B2 | * | 9/2011 | ........... H01L 23/315 |

* cited by examiner

PACKAGE STRUCTURE AND METHOD OF FORMING THE SAME

CROSS-REFERENCE TO RELATED APPLICATION

This application is a continuation application of and claims the priority benefit of a prior application Ser. No. 17/315,365, filed on May 10, 2021, now allowed. The prior application Ser. No. 17/315,365 is a continuation application of and claims the priority benefit of a prior application Ser. No. 16/354,173, filed on Mar. 15, 2019, now allowed. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out (InFO) packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
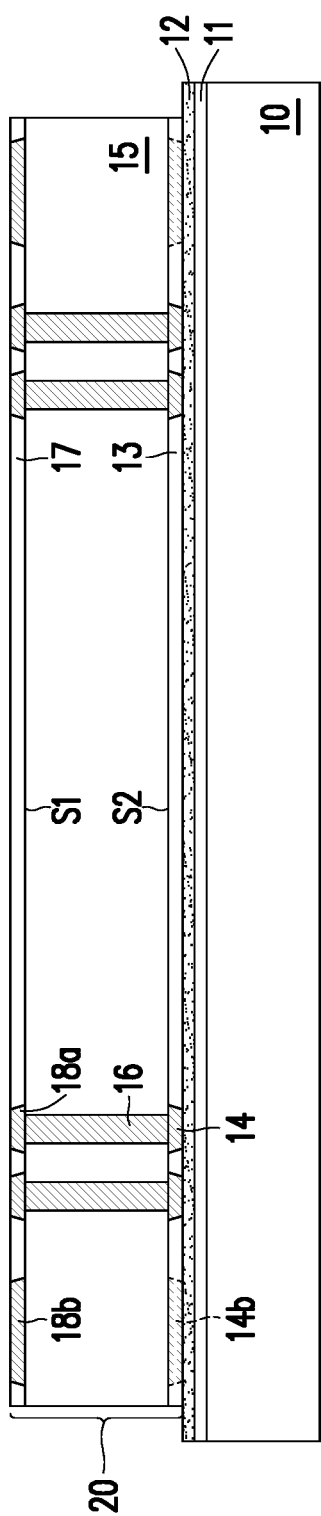
FIG. 1A to FIG. 1J are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views illustrating a forming method of a package structure according to a first embodiment of the disclosure.

Referring to FIG. 1A, a carrier 10 is provided. The carrier 10 may be a glass carrier, a ceramic carrier, or the like. In some embodiments, the carrier 10 has a de-bonding layer 11 formed thereon. The de-bonding layer 11 is formed by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent processes.

In some embodiments, a thermal dissipation structure 20 is disposed over the carrier 10 through pick and place processes. For example, the thermal dissipation structure 20 may be attached to the de-bonding layer 11 through an adhesive layer 12 such as a die attach film (DAF), silver paste, or the like. In some embodiments, the adhesive layer 12 has a size (such as, area or width) the same as the size of the carrier 10 and larger than the size of the thermal dissipation structure 20, but the disclosure is not limited thereto. In alternative embodiments, the adhesive layer 12 may have a size the same as the size of the thermal dissipation structure 20 and less than the size of the carrier 10. Although one thermal dissipation structure 20 is disposed on the carrier 10, the disclosure is not limited thereto. In some embodiments, a plurality of the thermal dissipation structure 20 are disposed on the carrier 10, and the number of the thermal dissipation structure 20 may be adjusted depending on the number of the die to be mounted over the carrier 10.

Still referring to FIG. 1A, in some embodiments, the thermal dissipation structure 20 includes a substrate 15, a plurality of pads 14, 18a and 18b, a plurality of through substrate vias (TSVs) 16, or/and the dielectric layers 13 and 17. The substrate 15 includes a material having excellent thermal dissipation property. The substrate 15 may also have a sufficient degree of rigidity. For example, the substrate 15 may include aluminum nitride, silicon nitride, aluminum oxide, the like, or combinations thereof. However, the disclosure is not limited thereto. The substrate 15 may include any suitable material having the properties described above.

The substrate 15 has a first surface S1 and a second surface S2 opposite to each other. In some embodiments, a plurality of pads are formed on the first surface S1 and second surface S2 of the substrate 15. For example, the pads 18a and 18b are disposed on the first surface S1 of the substrate 15, and the pads 14 or/and 14b are disposed on the second surface S2 of the substrate 15. The pads 18a on the first surface S1 may correspond to the pads 14 on the second surface S2. In some embodiments, the pad 18b has a larger size (e.g. width) than the pad 18a, and there may be no pad on the surface S2 corresponding to the pads 18b, but the disclosure is not limited thereto. In alternative embodiments, the thermal dissipation structure 20 may include pads 14b on the second surface S2 corresponding to the pads 18b. The pads 14, 14b, 18a and 18b may include conductive materials, such as metal or metal compound. For example, the pads 14, 18a and 18b may include copper. In some embodiments, the sidewalls of the pads 14, 14b, 18a and 18b may be straight or inclined, respectively. Depending on the product design, the pads 14, 14b, 18a and 18b may have any suitable shape.

In some embodiments, the dielectric layer 13 is disposed on the second surface S2 of the substrate 28 and laterally aside the pads 14 or/and 14b. The bottom surface of the dielectric layer 13 may be substantially coplanar with the bottom surfaces of the pads 14 or/and 14b. That is, the sidewalls of the pads 14 or/and 14b are covered by the dielectric layer 13 and the bottom surfaces of the pads 14 or/and 14b are exposed by the dielectric layer 13. The dielectric layer 17 is disposed on the first surface S1 of the substrate 28 and laterally aside the pads 18a and 18b. The top surface of the dielectric layer 17 may be substantially coplanar with the top surfaces of the pad 18a and 18b. That is, the sidewalls of the pads 18a and 18b are covered by the dielectric layer 17 and the top surfaces of the pads 18a and 18b are exposed by the dielectric layer 17. In some embodiments, the dielectric layers 13 and 17 may be solder resist films, but the disclosure is not limited thereto.

TSVs 16 are disposed in the substrate 28, and penetrate through the substrate 28 to electrically connect the pads 18a to the corresponding pads 14. The TSV 16 includes conductive materials such as copper, nickel, solder, alloys thereof, or the like. In some embodiments, the sidewalls of the TSVs 16 may be straight or inclined. In some embodiments, the pads 18b or/and the pads 14b are not connected to the TSV 16. The pads 18b or/and 14b may be electrically floating.

In some embodiments, the thermal dissipation structure 20 is free of active or passive devices. In alternative embodiments, the thermal dissipation structure 20 is free of active devices and may include passive device, the passive device may be embedded in the substrate 15 or disposed on the first or second surface of the substrate 15. It is noted that, the pads 14b may be optionally formed on the second surface S2 of the substrate 15, and are not shown in the following figures for the sake of brevity.

Figure 1B:
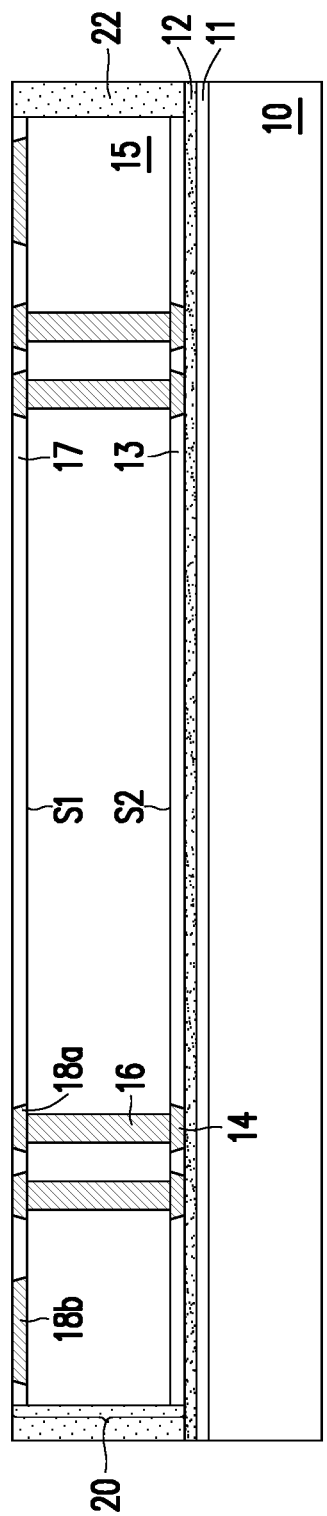

Referring to FIG. 1B, in some embodiments, an encapsulant 22 is formed over the carrier 10 and laterally aside the thermal dissipation structure 20, so as to encapsulate sidewalls of the thermal dissipation structure 20. In some embodiments, the encapsulant 22 includes a molding compound, a molding underfill, a resin such as epoxy, a combination thereof, or the like. In some other embodiments, the encapsulant 22 includes a photo-sensitive material such as polybenzoxazole (PBO), polyimide (PI), benzocyclobutene (BCB), a combination thereof, or the like. In alternative embodiments, the encapsulant 22 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 22 includes a composite material including a base material (such as polymer) and a plurality of fillers distributed in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other suitable shape.

The encapsulant 22 is formed by forming an encapsulant material layer over the carrier 10 by a suitable fabrication technique such as molding process, spin-coating, lamination, deposition, or similar processes. The encapsulant material layer encapsulates the top surface and sidewalls of the thermal dissipation structure 20. Thereafter, a planarization process is performed to remove a portion of the encapsulant material layer, such that the top surface of the thermal dissipation structure 20 is exposed. In some embodiments, the top surface of the encapsulant 22 is substantially coplanar with the top surface of the thermal dissipation structure 20. The planarization process may include a grinding or polishing process such as a chemical mechanic polishing (CMP) process.

Figure 1C:
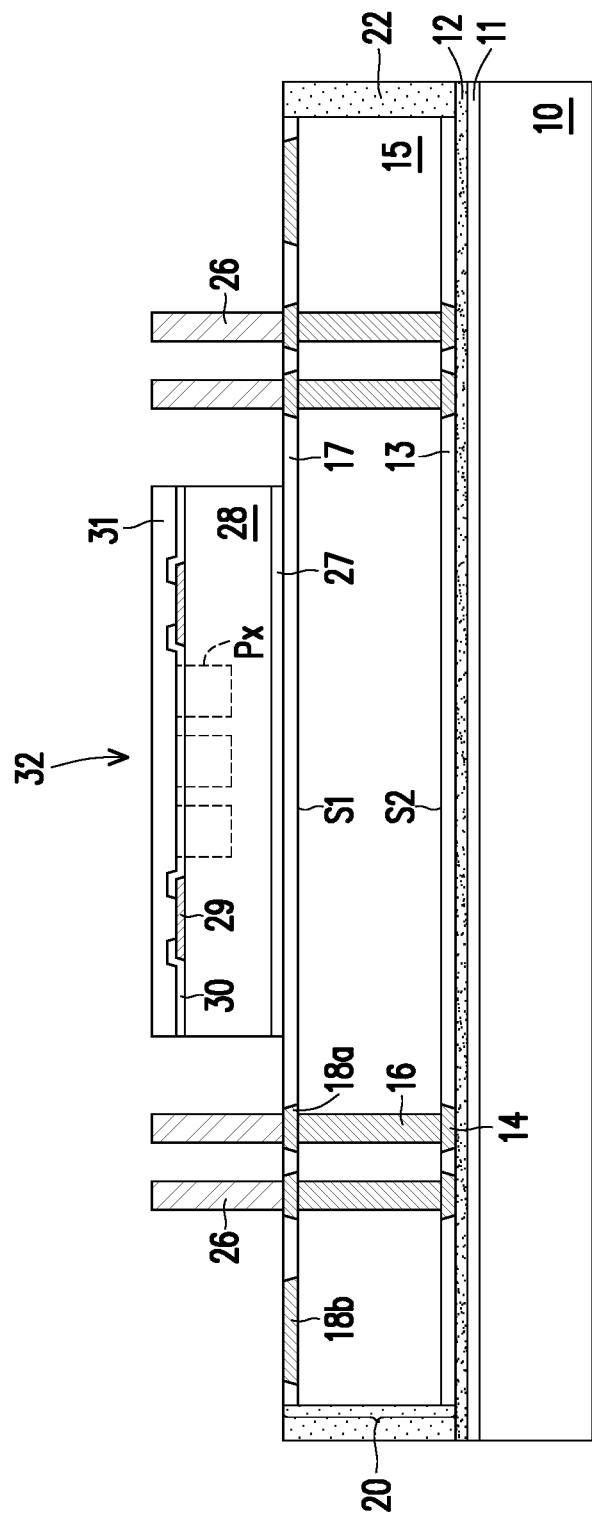

Referring to FIG. 1C, a plurality of through integrated fan-out vias (TIVs) 26 are formed on the thermal dissipation structure 20. In some embodiments, the TIVs 26 are formed on and electrically connected to the pads 18a, and further electrically connected to the pads 14 through the TSVs 16 of the thermal dissipation structure 20. The material of the TIV 26 may be the same as or different from the material of the TSV 16. In some embodiments, the TIVs 26 include copper, nickel, solder, alloys thereof, or the like. In some embodiments, the TIV 26 includes a seed layer and a conductive layer formed thereon (not shown). The seed layer is, for example, a titanium or/and copper composited layer. The conductive layer is, for example, a copper layer. The forming method of the TIVs 26 may include the following processes: forming a seed layer on the thermal dissipation structure 20 and the encapsulant 22 by a sputtering process, forming a patterned photoresist layer such as a dry film resist on the seed layer over the thermal dissipation structure 20. Thereafter, openings are formed in the photoresist layer, the openings expose portions of seed layer on the top surface of the pads 18a, and the conductive layers are then formed in the openings by electroplating. The patterned photoresist layer is then stripped, and the seed layer not covered by the conductive layers is removed. As such, the conductive layer and the underlying seed layer form the TIV 26. In some embodiments, the TIV 26 further includes a barrier layer (not shown) under the seed layer to prevent metal diffusion.

The material of the barrier layer includes, for instance, metal nitride such as titanium nitride, tantalum nitride, or a combination thereof.

Still referring to FIG. 1C, a die 32 is mounted to the thermal dissipation structure 20 by pick and place processes, for example. In some embodiments, the die 32 is attached to the thermal dissipation structure 20 through an adhesive layer 27 such as a die attach film (DAF), silver paste, or the like. In some embodiments, the die 32 is one of a plurality of dies cut apart from a wafer, for example. The die 32 may be an application-specific integrated circuit (ASIC) chip, an analog chip, a sensor chip, a wireless and radio frequency chip, a voltage regulator chip or a memory chip. The number of the die 32 shown in FIG. 1C is merely for illustration, and the disclosure is not limited thereto. In some embodiments, a plurality of dies 32 may be mounted over the carrier 10, and the plurality of dies 32 may be the same types of dies or the different types of dies. In some embodiments, as shown in FIG. 1C, one die 32 corresponds to one thermal dissipation structure 20, but the disclosure is not limited thereto. In alternative embodiments, more than one dies 32 may be corresponds to one thermal dissipation structure 20. For example, two dies 32 may be disposed on one thermal dissipation structure 20, and the two dies 32 may be disposed side by side. However, the disclosure is not limited thereto.

The die 32 is disposed between the TIVs 26, that is, the TIVs 26 are aside or around the die 32. In some embodiments, the die 32 may include a substrate 28, a plurality of pads 29, a passivation layer 30. In some embodiments, the substrate 28 is made of silicon or other semiconductor materials. Alternatively or additionally, the substrate 28 includes other elementary semiconductor materials such as germanium, gallium arsenic, or other suitable semiconductor materials. In some embodiments, the substrate 28 may further include other features such as various doped regions, a buried layer, and/or an epitaxy layer. Moreover, in some embodiments, the substrate 28 is made of an alloy semiconductor such as silicon germanium, silicon germanium carbide, gallium arsenic phosphide, or gallium indium phosphide. Furthermore, the substrate 28 may be a semiconductor on insulator such as silicon on insulator (SOI) or silicon on sapphire.

In some embodiments, a plurality of devices (not shown) are formed in or on the substrate 28. The devices may be active devices, passive devices, or combinations thereof. In some embodiments, the devices are integrated circuit devices. The devices are, for example, transistors, capacitors, resistors, diodes, photodiodes, fuse devices, or the like, or combinations thereof.

In some embodiments, an interconnection structure and a dielectric structure are formed over the devices on the substrate 28. The interconnection structure is formed in the dielectric structure and connected to different devices in or on the substrate 28 to form a functional circuit. In some embodiments, the dielectric structure includes an inter-layer dielectric layer (ILD) and one or more inter-metal dielectric layers (IMD). In some embodiments, the interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to connect the metal lines in different layers.

The pads 29 may be or electrically connected to a top conductive feature of the interconnection structure, and further electrically connected to the devices formed on the substrate 28 through the interconnection structure. The material of the pads 29 may include metal or metal alloy, such as aluminum, copper, nickel, or alloys thereof.

The passivation layer 30 is formed over the substrate 28 and covers a portion of the pads 29. A portion of the pads 29 is exposed by the passivation layer 30 and serves as an external connection of the die 32. The passivation layer 30 includes an insulating material such as silicon oxide, silicon nitride, polymer, or a combination thereof. The polymer may include PBO, PI, BCB, the like or combinations thereof.

In some embodiments, the die 32 is a sensor chip and includes a plurality of the pixel regions Px. The pixel regions Px may extend from the top surface of the passivation layer 30 to the device layer on the substrate 28, but the disclosure is not limited thereto. In some embodiments, the pixel regions Px are disposed between the pads 29, for example.

In the embodiments in which the die 32 is a sensor chip, the die 32 may further include a sacrificial film 31 over the substrate 28 and covering the surfaces of the pads 29 and the passivation layer 30. That is, the pixel regions Px are covered by the sacrificial film 31. In some embodiments, the material of the sacrificial film 31 is different from the materials of the passivation layer 30 and the encapsulant 22 and the subsequently formed encapsulant 34. For example, the sacrificial film 30 may include a polymer such as polybenzoxazole (PBO), polyimide (PI), benzocyclobutene (BCB), a combination thereof, or the like, but the disclosure is not limited thereto. In some embodiments, the die 32 is free of a connector on the pads 29, but the disclosure is not limited thereto.

Figure 1D:
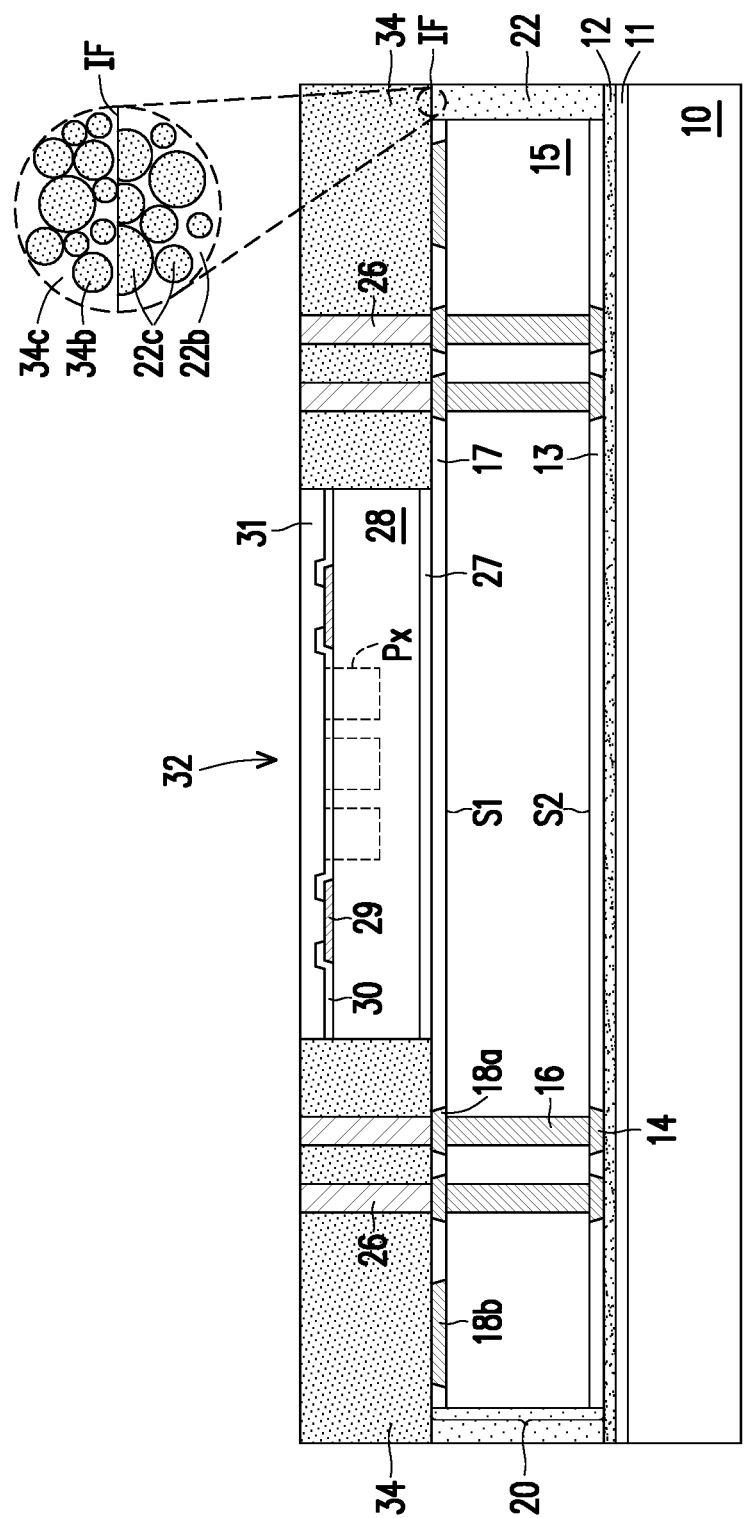

Referring to FIG. 1D, in some embodiments, an encapsulant 34 is formed on the thermal dissipation structure 20 and the encapsulant 22, and laterally aside the die 32 and the TIVs 26. The encapsulant 34 laterally encapsulates sidewalls of the die 32 and the TIVs 26. The material of the encapsulant 34 is similar to, and may be the same as or different from the material of the encapsulant 22. In some embodiments, the encapsulant 34 is formed by forming an encapsulant material layer over the thermal dissipation structure 20 and the encapsulant 22. The encapsulant material layer covers sidewalls and top surfaces of the die 32 and the TIVs 26. Thereafter, a planarization process such as a CMP process is performed to remove a portion of the encapsulant material layer over the top surfaces of the die 32 and the TIVs 26, such that the top surfaces of the sacrificial layer 31 and the TIVs 26 are exposed. In some embodiments in which the die 32 and the TIVs 26 have different heights, a portion of the sacrificial layer 31 or portions of the TIVs 26 may also be removed by the planarization process. After the planarization process is performed, the top surface of the encapsulant 34, the top surfaces of the TIVs 26 and the top surface of the die 32 (that is, the top surface of the sacrificial film 31) are substantially coplanar with each other.

Still referring to FIG. 1D, in this embodiment, since the encapsulant 22 and the encapsulant 34 are formed successively, an interface IF is existed between the encapsulant 22 and the encapsulant 34. In some embodiments, the encapsulant 22 includes a base material 22b and a plurality of fillers 22c in the base material 22b, the encapsulant 34 includes a base material 34b and a plurality of fillers 34c in the base material 34b. In some embodiments, the fillers 34b and 22b may be spherical particles and have rounded or arced surface. Since the surface of the encapsulant 22 was subjected to a planarization process, some of the fillers 22c contacting the encapsulant 34 are cut and partially removed by the planarization process, and thus have flat surface. While the fillers 34b contacting the encapsulant 22 have rounded or arced surface.

Figure 1E:
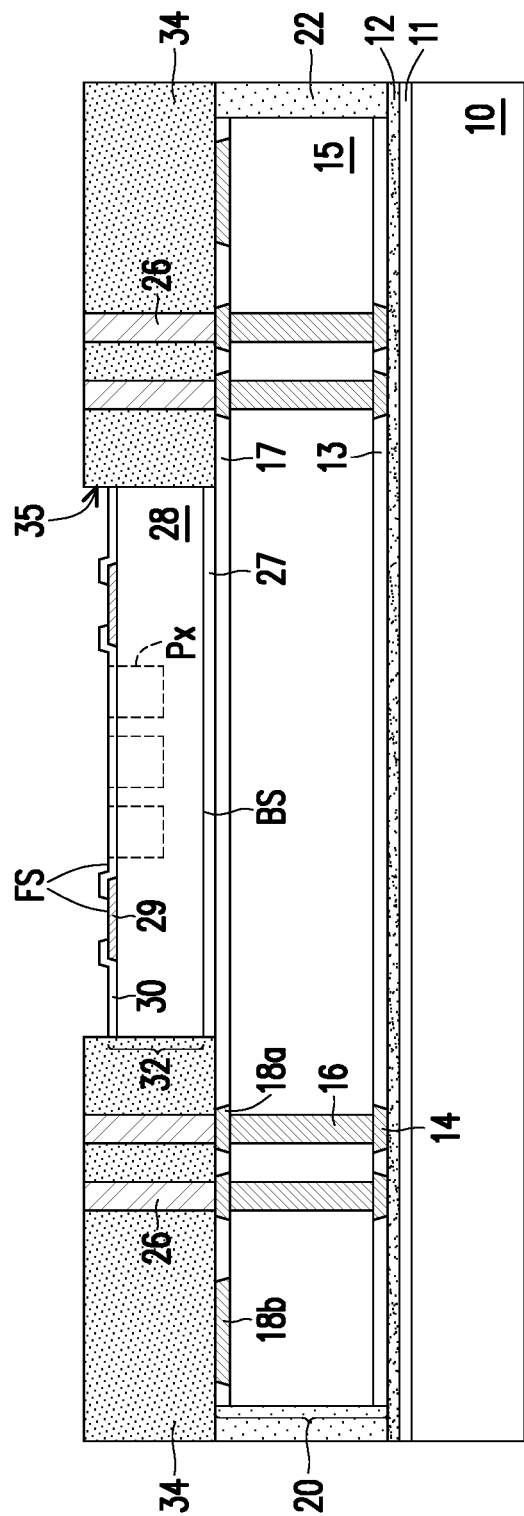

Referring to FIG. 1D and FIG. 1E, the sacrificial film 31 is removed to expose the pads 29 and the passivation layer 30 of the die 32. The sacrificial film 31 may be removed by a suitable technique such as an etching process, a laser irradiation process, or the like. The etching process may include dry etching, wet etching or a combination thereof.

Referring to FIG. 1E, after the sacrificial film 31 is removed, the top surfaces of the pads 29 and the top surface of the passivation layer 30 are exposed, and constitute a first surface FS of the die 32. The first surface FS of the die 32 is lower than the top surface of the encapsulant 34 and the top surfaces of the TIVs 26. In some embodiments, the first surface FS may also be referred to as the front surface or active surface of the die 32. The die 32 has a second surface BS opposite to the first surface FS. The second surface BS is a bottom surface of the substrate 28, and may also be referred to as a back surface of the die 32.

After the sacrificial film 31 is removed, a recess 35 is formed at the previous location of the removed sacrificial film 31. In other words, a recess 35 is formed over the die 32 and within the encapsulant 34, and a portion of sidewalls of the encapsulant 34 is exposed by the recess 35.

Figure 1F:
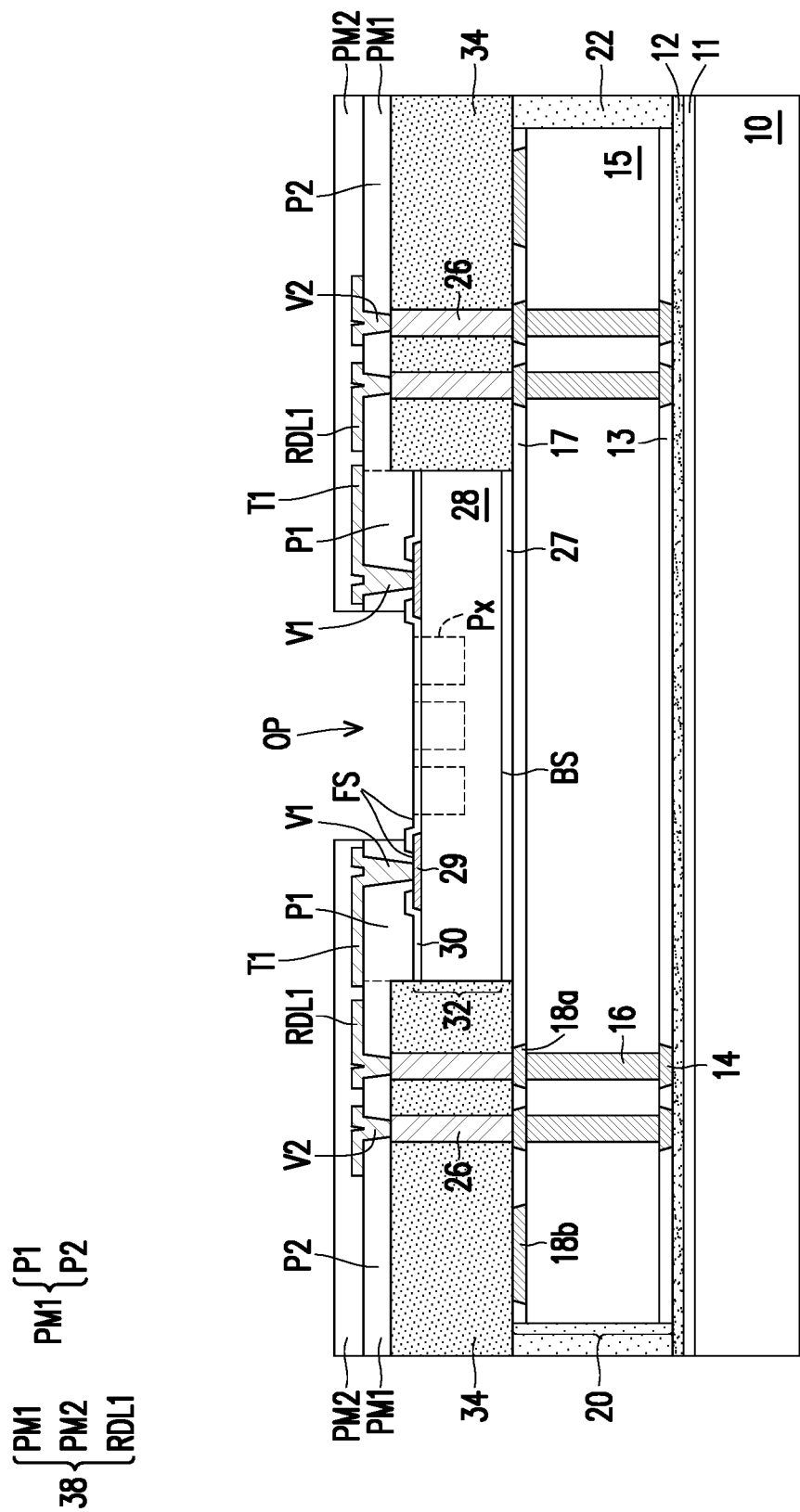

Referring to FIG. 1F, a redistribution layer (RDL) structure 38 is formed on the die 32, the TIVs 26 and the encapsulant 34. The RDL structure 38 is electrically connected to the die 32 and the TIVs 26, and further electrically connected to the thermal dissipation structure 20 through the TIVs 26. In some embodiments, the RDL structure 38 is referred to as a "front-side RDL structure" formed on a front side of the die 32. Through the specification, wherein the "front-side" refers to a side close to the pads 29 of the die 32.

In some embodiments, the RDL structure 38 includes a polymer layer PM1, a polymer layer PM2 and a redistribution layer RDL1. The number of the polymer layers or the redistribution layers shown in FIG. 1F is merely for illustration, and the disclosure is not limited thereto. In some embodiments, a portion of the RDL structure 38 fills into the recess 35 (FIG. 1E) to connect to the die 32, and the portion of the RDL structure 38 is laterally aside the TIVs 26 and the encapsulant 34 and surrounded by the encapsulant 34. In some embodiments, the portion of the RDL structure 38 is in physical contact with the sidewalls of the encapsulant 34 exposed by the recess 35 (FIG. 1E). In some embodiments, the RDL structure 38 includes an opening OP, exposing a portion of the front surface FS of the die 30. In some embodiments, the pads 29 are covered by the RDL structure 38, while a portion of the top surface of the passivation layer 30 and the pixel regions Px of the die 32 are exposed by the opening OP of the RDL structure 38.

In some embodiments, each of the polymer layers PM1, PM2 includes a photo-sensitive material such as polybenzoxazole (PBO), polyimide (PI), benzocyclobutene (BCB), a combination thereof or the like, but the disclosure is not limited thereto. The polymer layer PM1/PM2 may be formed by forming a polymer material layer over the die 32 and the encapsulant 34 through a suitable technique such as spin coating, chemical vapor deposition (CVD), plasma-enhanced chemical vapor deposition (PECVD), lamination or the like. Thereafter, the polymer material layer is patterned, such that the polymer layer PM1/PM2 having the opening OP is formed. The patterning method may include exposure and development process, laser drilling process, or the like, or a combination thereof.

In some embodiments, the redistribution layer RDL1 includes conductive materials. The conductive materials include metal such as copper, nickel, titanium, a combination thereof or the like. The forming method of the redistribution layer RDL1 may include physical vapor deposition (PVD) such as sputtering process, and electroplating process. In some embodiments, the redistribution layer RDL1 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metals.

In some embodiments, the polymer layer PM1 is disposed on the encapsulant 34 and partially fills into the recess 35 (FIG. 1E). The polymer layer PM1 covers the top surface of the encapsulant 34, portions of the top surfaces of the TIVs 26, and a portion of the front surface FS of the die 32. In some embodiments, the top surfaces of the pads 29 and a portion of the top surface of the passivation layer 30 are covered by the polymer layer PM1, and another portion of the top surface of the passivation layer 30 is exposed by the polymer layer PM1. In some embodiments, the polymer layer PM1 includes a first portion P1 and a second portion P2 connected to each other. The first portion P1 of the polymer layer PM1 is disposed over the die 32. In some embodiments, the first portion P1 of the polymer layer PM1 is laterally aside and in physical contact with a portion of sidewalls of the encapsulant 34. The second portion P2 of the polymer layer PM1 is disposed over the encapsulant 34 and the TIVs 26 and laterally aside the first portion P1. In some embodiments, the thickness of the first portion P1 is greater than the thickness of the second portion P2.

The redistribution layer RDL1 penetrates through the polymer layer PM1 and is electrically connected to the pads 29 of the die 32 and the TIVs 26. The polymer layer PM2 is disposed on the polymer layer PM1 and the redistribution layer RDL1, covering the top surface of the polymer layer PM1 and the top surface and sidewalls of the redistribution layer RDL1.

In some embodiments, the redistribution layer RDL1 includes a plurality of vias V1 and V2 and traces T1 connected to each other. The vias V1 penetrates through the first portion P1 of polymer layer PM1, so as to connect the traces T1 of the redistribution layer RDL1 to the pads 29 of the die 32. The vias V2 penetrates through the second portion P2 of the polymer layer PM1, so as to connect the traces T1 of the redistribution layer RDL1 to the TIVs 26. In some embodiments, the height of the via V1 is larger than the height of the via V2, and the bottom surface of the via V1 is lower than the bottom surface of the via V2. Portions of the vias V1 are laterally aside the encapsulant 34 and the TIVs 26. The traces T1 are located on and extending on the top surface of the polymer layer PM1.

The sidewalls of the vias V1 and V2 and the traces T1 may be straight or inclined, respectively. The cross-sectional shape of the via V1/V2 may be square, rectangle, trapezoid, or the like, but the disclosure is not limited thereto. In some embodiments, the via V1/V2 has inclined sidewalls and is tapered toward the first surface FS of the die 32 or the top surface of the TIV 26.

Figure 1G:
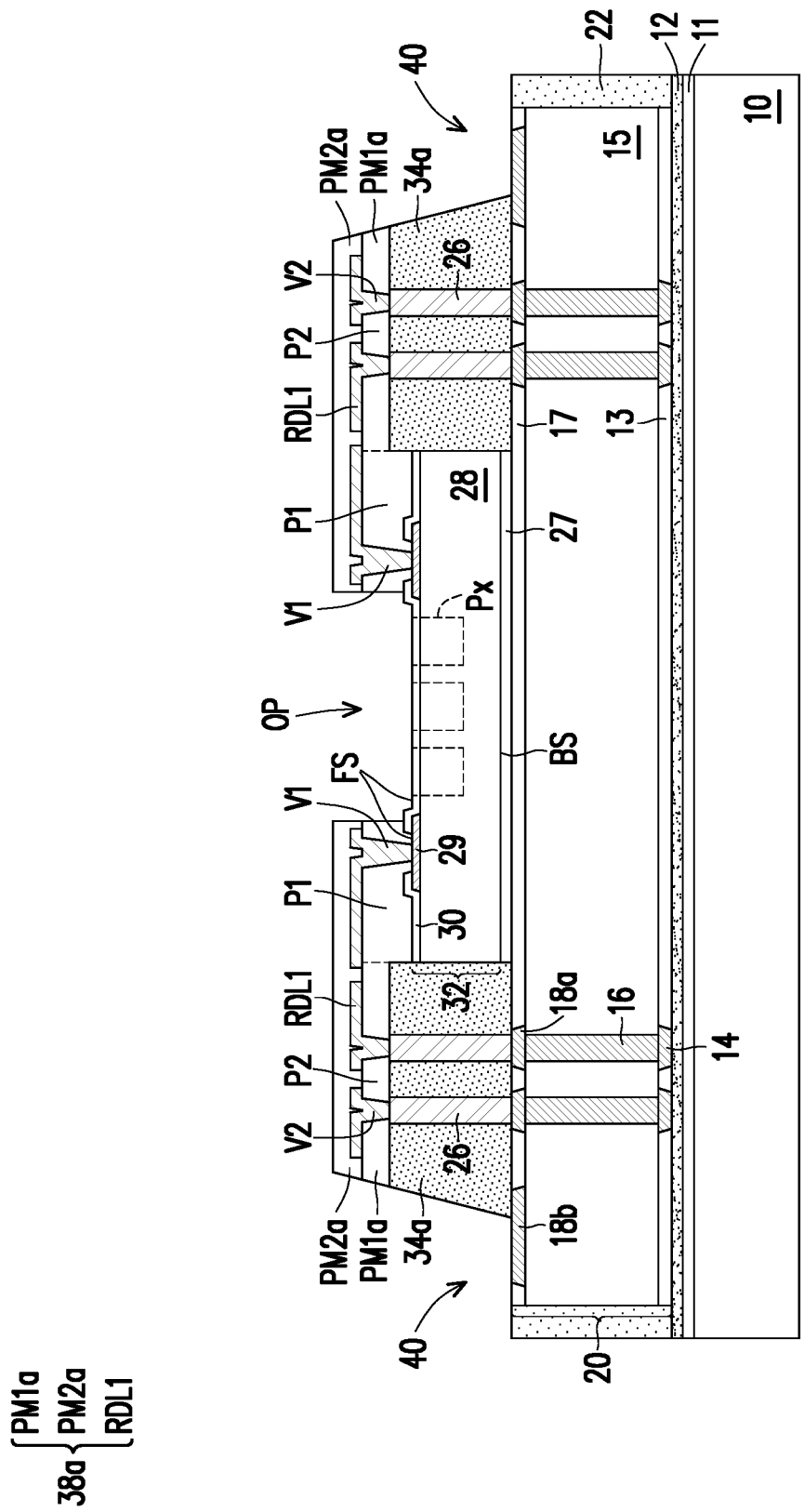

Referring to FIG. 1F to FIG. 1G, in some embodiments, a removal process is performed to create a landing region 40.

The landing region 40 may be used to landing a thermal dissipation shroud thereon. In some embodiments, the landing region 40 may also be referred to as a thermal dissipation shroud landing region. In some embodiments, portions of the encapsulant 34 and the polymer layers PM1, PM2 are removed, and an encapsulant 34a, a polymer layer PM1a and a polymer layer PM2a are remained. The removal process may include one or more etching process, laser process, or a combination thereof, but the disclosure is not limited thereto. In some embodiments, the sidewalls of the polymer layers PM2a, PM1a, and the encapsulant 34a may be straight or inclined. For example, the polymer layers PM2a, PM1a and the encapsulant 34a may be tapered away from the top surface of the thermal dissipation structure 20. However, the disclosure is not limited thereto.

Referring to FIG. 1G, after the removal process is performed, at least a portion of the top surface of the encapsulant 22 and a portion of the top surface of the thermal dissipation structure 20 are exposed. In some embodiments, a portion of the top surface of the dielectric layer 17 and at least portions of the top surfaces of the pads 18b of the thermal dissipation structure 20 are exposed. In alternative embodiments, the top surfaces of the pads 18b may be completely exposed. The exposed surfaces of the thermal dissipation structure 20 and the encapsulant 22 form the landing region 40 for landing a thermal dissipation shroud thereon.

Figure 1H:
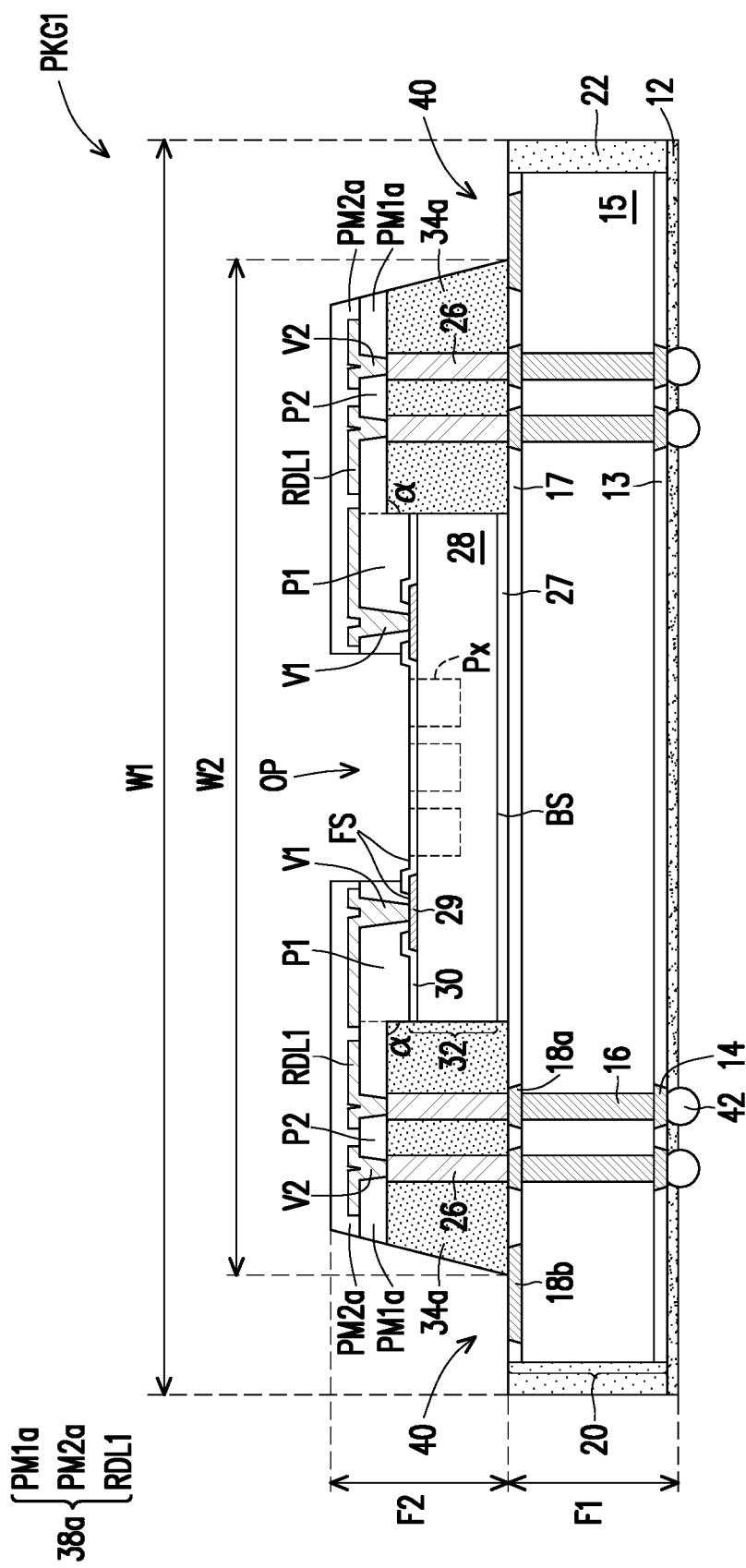

Referring to FIG. 1G and FIG. 1H, the carrier 10 is de-bonded from the overlying structure thereof. In some embodiments, the de-bonding layer 11 is decomposed under the heat of light, and the carrier 10 is then released, and the bottom surface of the adhesive layer 12 is exposed. In some embodiments, at least a portion of the adhesive layer 12 is then removed to expose portions of the bottom surfaces of the pads 14 of the thermal dissipation structure 20. Thereafter, a plurality of connectors 42 are formed over and electrically connected to the pads 14 exposed by the adhesive layer 12. The connectors 42 are electrically connected to the die 32 through the pads 14, the TSVs 16 and the pads 18a of the thermal dissipation structure 20, the TIVs 26 and the RDL structure 38a. The connector 42 may also be referred to as a conductive terminal. In some embodiments, the connectors 42 are made of a conductive material with low resistivity, such as Sn, Pb, Ag, Cu, Ni, Bi or an alloy thereof, and are formed by a suitable process such as evaporation, plating, ball drop, or screen printing. However, the disclosure is not limited thereto. In alternative embodiments, after the carrier 10 is released, the adhesive layer 12 may be removed completely, such that the bottom surfaces of the thermal dissipation structure 20 and the encapsulant 22 are exposed, and the conductive terminals 42 are then formed on the exposed pads 14 of the thermal dissipation structure 20.

Referring to FIG. 1H, in some embodiments, a package structure PKG1 is thus formed. The package structure PKG1 may also be referred to as an integrated fan-out (InFO) package structure. The package structure PKG1 includes the thermal dissipation structure 20, the encapsulant 22, the die 32, the TIVs 26, the encapsulant 34a and the RDL structure 38a. The thermal dissipation structure 20 is disposed on the back side of the die 32, that is, the thermal dissipation structure 20 is disposed over the back surface BS of the die 32. The encapsulant 22 is laterally aside the thermal dissipation structure 20 to encapsulate sidewalls of the thermal dissipation structure 20.

The die 32 is disposed on the thermal dissipation structure 20. The TIVs 26 are aside the die 32 and electrically connected to the thermal dissipation structure 20. The encapsulant 34a laterally encapsulates sidewalls of the die 32 and sidewalls of the TIVs 26. The RDL structure 38a is disposed on the front surface FS of the die 32. In some embodiments, the die 32 is electrically connected to the thermal dissipation structure 20 through the RDL structure 38a and the TIVs 26.

In some embodiments, the top surface of the encapsulant 34a and the top surfaces of the TIVs 26 are substantially coplanar with each other. The front surface FS of the die 32 and the bottommost surfaces of the polymer layer PM1a and the vias V1 of the RDL structure 38a are lower than the top surface of the encapsulant 34a and the top surfaces of the TIVs 26. In some embodiments, a portion of the sidewalls and the top surface of the encapsulant 34a are covered by and in physical contact with the polymer layer PM1a, that is, the corners a of the encapsulant 34a are covered by and in physical contact with the polymer layer PM1a.

In other words, a portion of the polymer layer PM1a and portions of the vias V1 of the redistribution layer RDL1 are laterally aside the encapsulant 34a and the TIVs 26. The sidewalls of the portion of the polymer layer PM1a are encapsulated by the encapsulant 34a.

In some embodiments, the RDL structure 38a has the opening OP, exposing a portion of the top surface of the passivation layer 30 and the pixel regions Px of the die 32. The die 32 of the package structure PKG1 may transmit or/and receive signals. The opening OP of the RDL structure 38a may be helpful for signal transmission or/and reception. In some embodiments, the passivation layer 30 is a membrane, and the package structure PKG1 may transmit a signal through the vibration of the membrane. In some embodiments, the die 32 of the package structure PKG1 may receive signals such as optical signals or other forms of propagated signals such as ultrasonic waves. For example, the pixel regions Px may receive signals such as optical signals, and the signals received by the pixel regions Px may further be propagated to the devices such as the photodiodes included in the die 32, but the disclosure is not limited thereto.

In some embodiments, the thermal dissipation structure 20 and the encapsulant 22 or/and the adhesive layer 12 together constitute a first floor structure F1 of the package structure PKG1, the die 32, the TIVs 26, the encapsulant 34a and RDL structure 38a together constitute a second floor structure F2 of the package structure PKG2. The first floor structure F1 and the second floor structure F2 may have different sizes. For example, the width W2 of the second floor structure F2 may be less than the width W1 of the first floor structure F1. The width W2 refers to the bottom width of the second floor structure F2, and the width W1 refers to the top width of the first floor structure F1. Such a size difference between the first floor structure F1 and the second floor structure F2 create a thermal dissipation shroud landing region 40 for subsequent process.

Figure 1I:
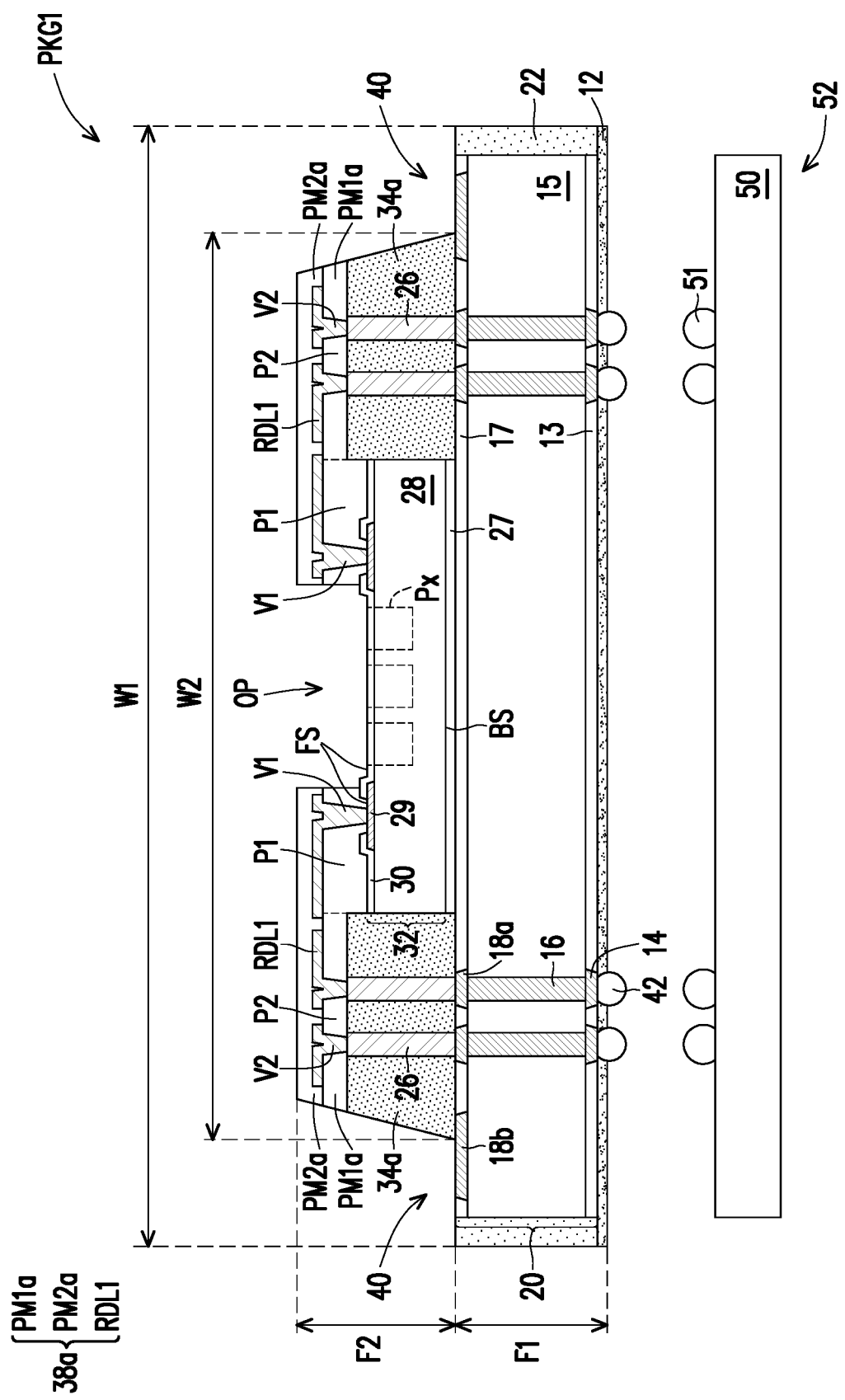

Still referring to FIG. 1H and FIG. 1I, in some embodiments, the package structure PKG1 may further be coupled to other package components. For example, a printed circuit board (PCB) 52 is provided. In some embodiments, the printed circuit board 52 includes a body structure 50 and a plurality of connectors 51 over the body structure 50. In some embodiments, the connectors 51 are referred as conductive terminals. The materials of the connectors 51 are similar to those of the connector 42 of the package structure PKG1. In some embodiments, the connectors 51 are located at the positions corresponding to the positons of the connectors 42 of the package structure PKG1. The size of the connector 51 and the size of the connector 42 may be the same or different. In some embodiments, the size (e.g. width) of the PCB 52 may be the same as or different from the size of the package structure PKG1.

Figure 1J:
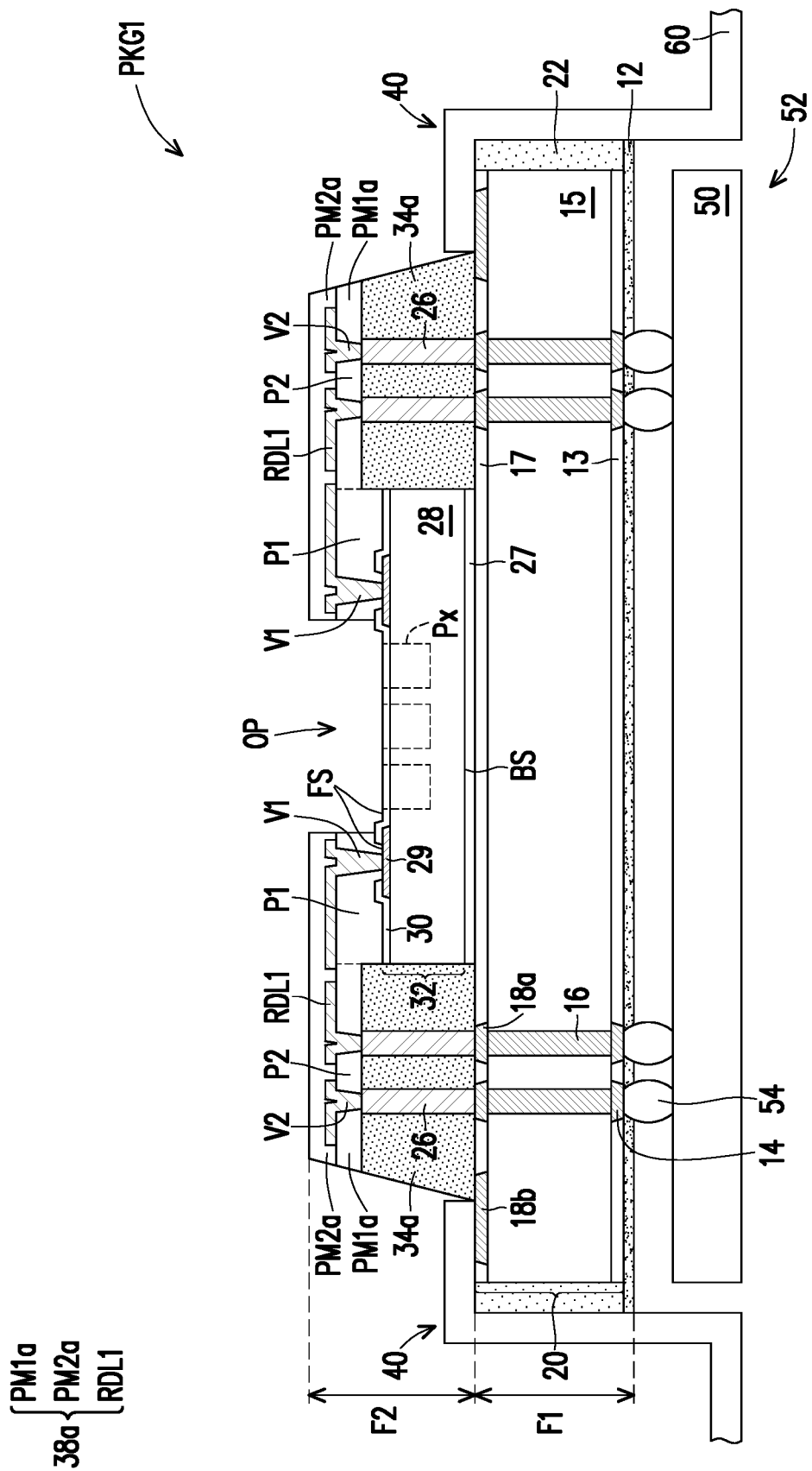

Referring to FIG. 1I and FIG. 1J, in some embodiments, the package structure PKG1 is electrically coupled to the PCB 52 through a surface mount technology (SMT) process. For example, a reflow process is performed on the connectors 42 and the connectors 51. In some embodiments, the connectors 42 and the connectors 51 are fused with each other, and a connector 54 is formed to connect the package structure PKG1 to the PCB 52. In other words, the connector 54 is formed of the connector 42 and the connector 51.

Still referring to FIG. 1J, in some embodiments, a thermal dissipation shroud 60 is configured on the package structure PKG1 and the PCB 52. For example, the thermal dissipation shroud 60 is landing on the thermal dissipation shroud landing region 40, and is in physical contact with portions of the top surfaces of the pads 18b and the dielectric layer 17 of the thermal dissipation structure 20, the top surface and sidewalls of the encapsulant 22, or/and the sidewalls of the adhesive layer 12, or/and the sidewalls of the PCB 52. The thermal dissipation shroud 60 may or may not in physical contact with the encapsulant 34a. In some embodiments, the thermal dissipation shroud 60 and the pads 18b are electrically isolated from other components of the package structure PKG1 or the PCB 52.

The thermal dissipation shroud 60 includes a material having excellent thermal dissipation property. In some embodiments, the thermal dissipation shroud 60 includes a material the same as or different form the material of the substrate 15 of the thermal dissipation structure 20. For example, the thermal dissipation shroud 60 may include a metal such as aluminum, aluminum nitride, silicon nitride, aluminum oxide, the like, or combinations thereof. However, the disclosure is not limited thereto. The thermal dissipation shroud 60 may include any suitable material having good or excellent thermal dissipation property.

In some embodiments, the thermal dissipation shroud 60 may be ring-shaped, surrounding the first floor structure F1 and a portion of the second floor structure F2 of the package structure PKG1. However, the disclosure is not limited thereto. The thermal dissipation shroud 60 may have any suitable shape according to product design.

In the first embodiment, the thermal dissipation structure 20 is disposed on back side of the die 32 to conduct heat away from the die 32 of the package structure PKG1. The thermal dissipation structure 20 may also provide a sufficient degree of rigidity to avoid or reduce the warpage of the package structure PKG1. Further, the thermal dissipation shroud 60 may also help to conduct heat away from the package structure PKG1. As such, the package structure PKG1 has excellent thermal dissipation performance, the thermal dissipation structure 20 and the thermal dissipation shroud 60 may effectively conduct heat away from the package structure PKG1, and maintain the package structure PKG1 in a suitable operation temperature such as lower than 40° C. In some embodiments, the package structure PKG1 includes a sensor chip for medical use, which requires excellent thermal dissipation performance.

FIG. 2A to FIG. 2F illustrates a method of forming a package structure according to a second embodiment of the disclosure. The second embodiment is similar to the first embodiment, except that the forming method of the thermal dissipation shroud landing region is different.

Figure 2A:
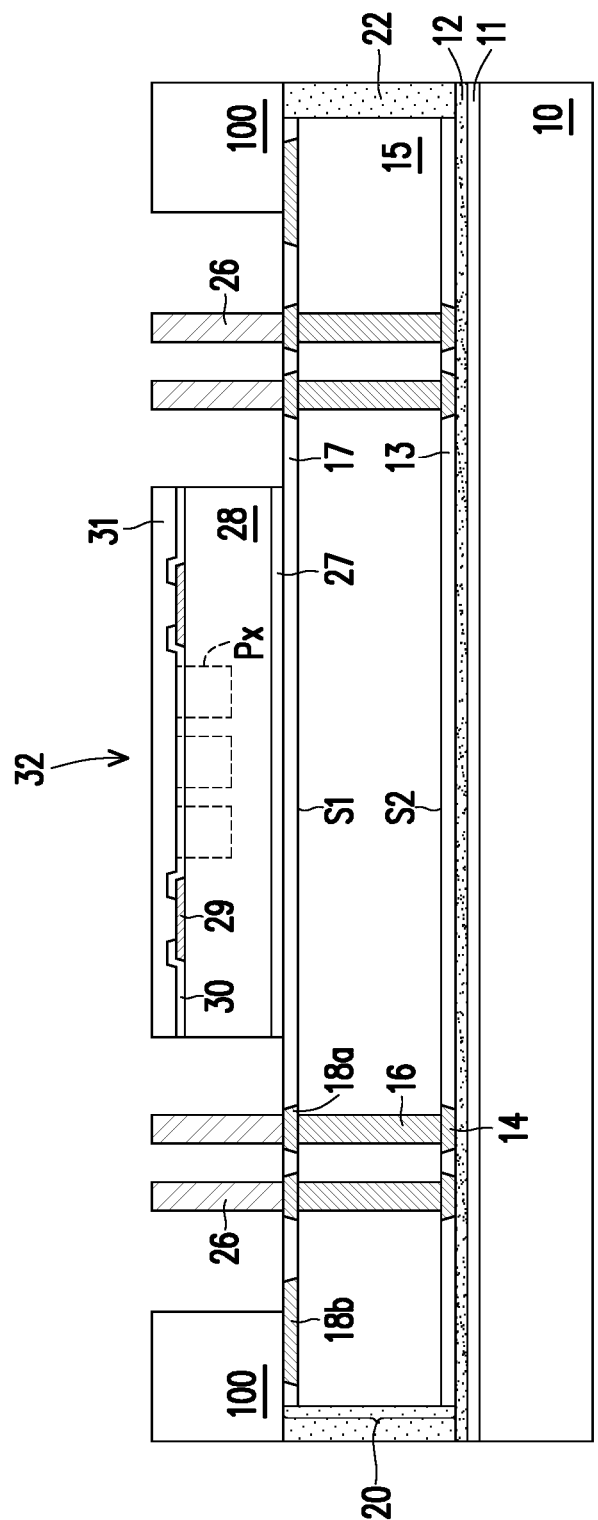
FIG. 2A to FIG. 2F are schematic cross-sectional views illustrating a method of forming a package structure according to a second embodiment of the disclosure.

Referring to FIG. 1C and FIG. 2A, in some embodiments, after the encapsulant 22 is formed aside the thermal dissipation structure 20, the TIVs 26 are formed to electrically connected to the pads 18a, the die 32 is attached to the thermal dissipation structure 20 through the adhesive layer 27. Further, one or more sacrificial bricks 100 are disposed over the carrier 10. In some embodiments, the sacrificial bricks 100 are disposed at the location where a thermal dissipation shroud is to be landed. For example, the sacrificial brick 100 may cover at least a portion of the top surface of the encapsulant 22 and a portion of the top surface of the thermal dissipation structure 20. In some embodiments, a portion of the top surface of the dielectric layer 17 and a portion of the top surface of the pad 18b at the edge of the thermal dissipation structure 20 are covered by the sacrificial brick 100.

In some embodiments, the material of the sacrificial brick 100 is different from the material of the sacrificial film 31 of the die 32, and is different from the subsequently formed encapsulant 134. For example, the sacrificial brick 100 may include a polymer. In some embodiments, the sacrificial brick 100 includes a material the same as the material of the adhesive layer 12 or 27. However, the disclosure is not limited thereto. In some embodiments, the sacrificial brick 100 may be formed by pick and place processes and curing process, or lamination and curing processes, but the disclosure is not limited thereto.

Figure 2B:
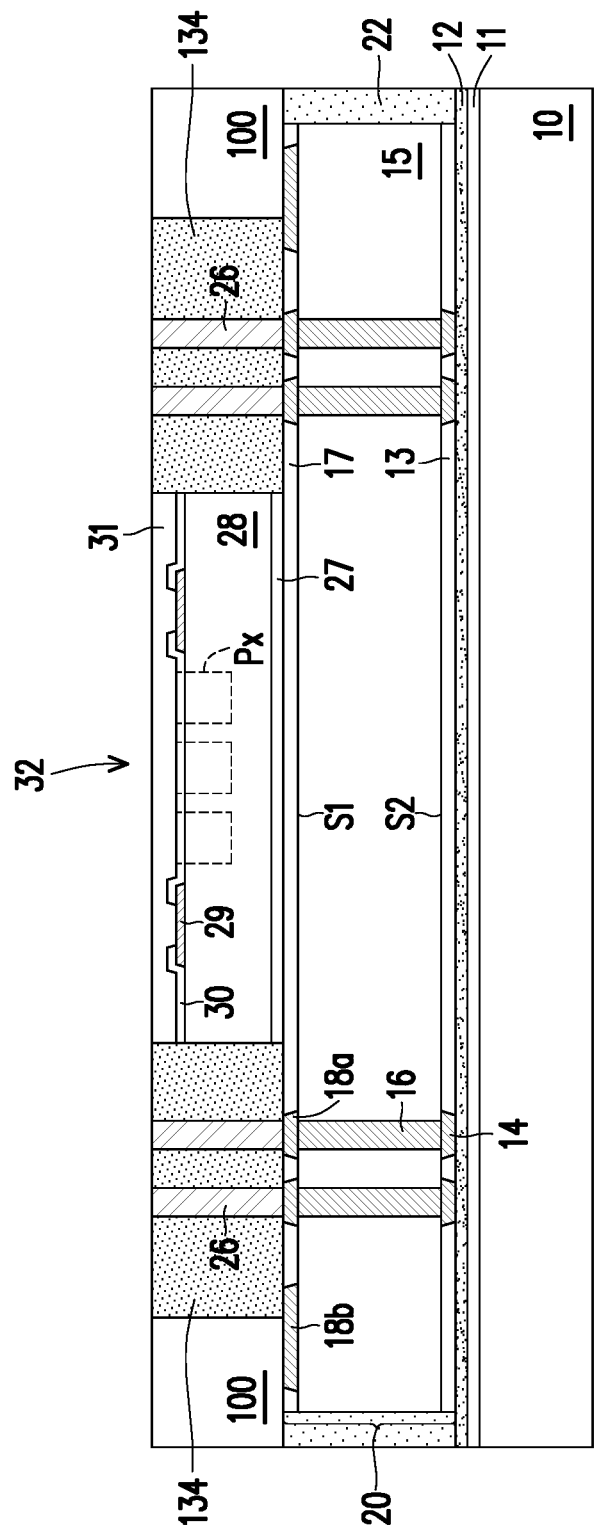

Referring to FIG. 2B, thereafter, an encapsulant 134 is formed on the thermal dissipation structure 20 to laterally encapsulate sidewalls of the die 32 and sidewalls of the TIVs 26. In some embodiments, the encapsulant 134 is disposed between the sacrificial bricks 100. The material and forming method of the encapsulant 134 are similar to, and may be the same as or different from those of the encapsulant 34 (FIG. 1D), which are not described again. In some embodiments, the top surface of the encapsulant 134, the top surface of the TIVs 26, and the top surface of the sacrificial film 31 of the die 32 are substantially coplanar with each other. In some embodiments, the top surface of the sacrificial brick 100 may be substantially coplanar with the top surface of the encapsulant 134, but the disclosure is not limited thereto.

Figure 2C:
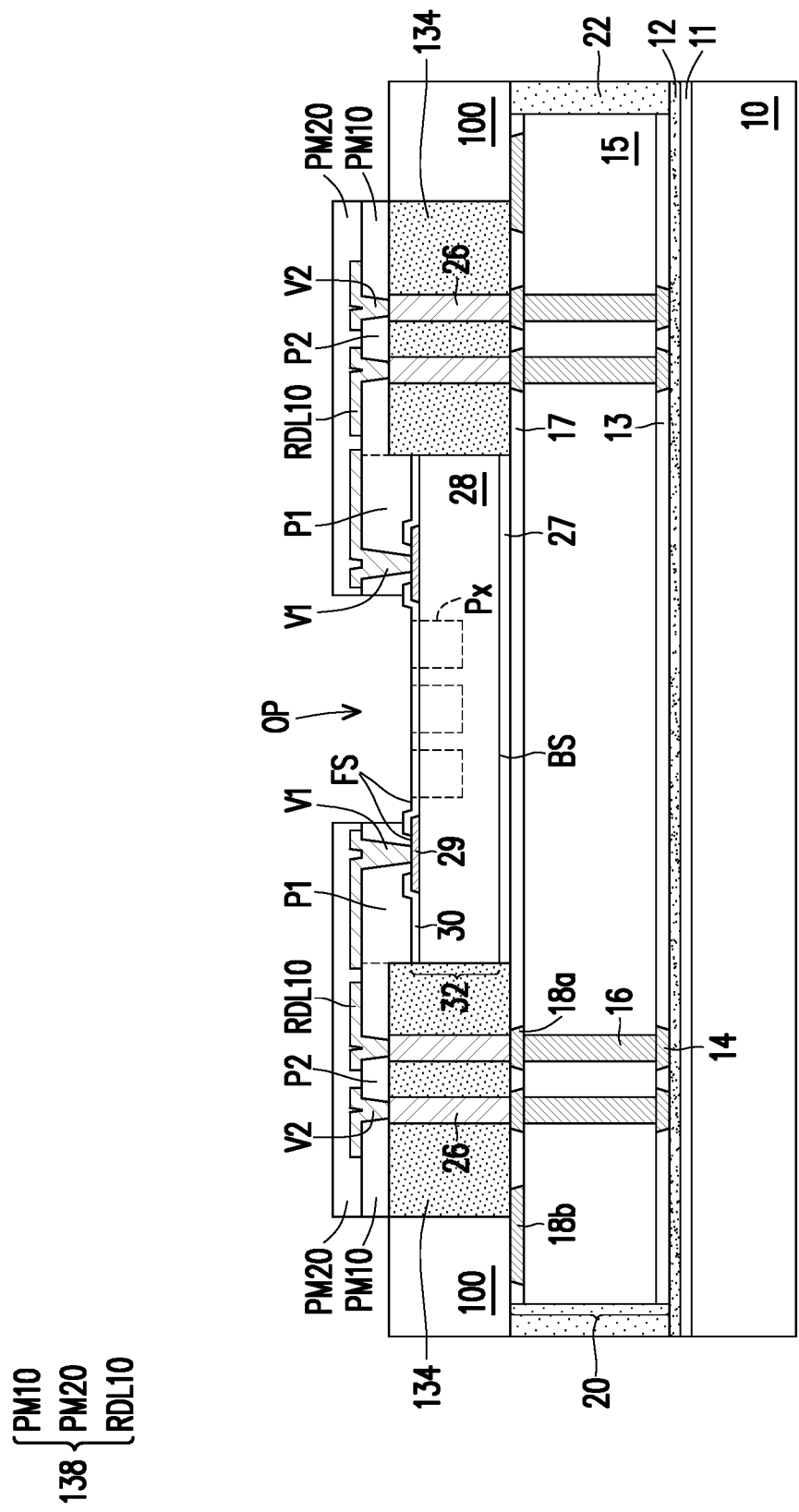

Referring to FIG. 2B and FIG. 2C, the sacrificial film 31 of the die 32 is removed. Thereafter, a RDL structure 138 is formed over the die 32 and the encapsulant 134 to electrically connected to the die 32 and the TIVs 26. The RDL structure 138 is not formed on the sacrificial brick 100. In some embodiments, the RDL structure 138 includes the polymer layers PM10, PM20 and the redistribution layer RDL10. The structure and the forming method of the RDL structure 138 are similar to those of the RDL structure 38 described in the first embodiment, which are not described again. In some embodiments, the sidewalls of the RDL structure 138 are substantially aligned with the sidewalls of the encapsulant 134, but the disclosure is not limited thereto.

Figure 2D:
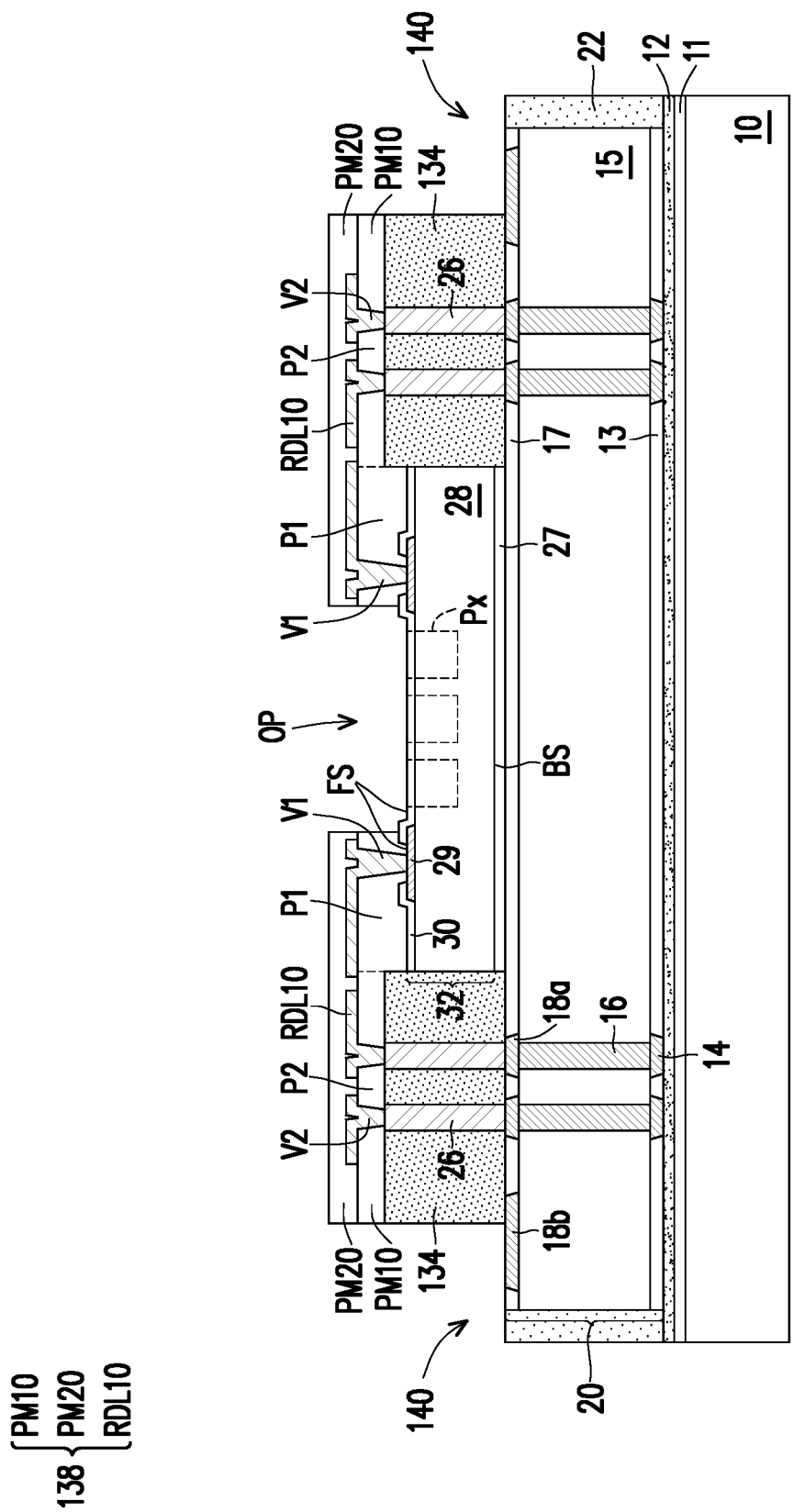

Referring to FIG. 2C and FIG. 2D, thereafter, the sacrificial bricks 100 are removed to expose the top surface of the encapsulant 22 and a portion of the top surface of the thermal dissipation structure 20, such that a landing region 140 is created. In some embodiments, the sacrificial bricks 100 may be removed by a stripping process, an etching process such as dry etching or wet etching, but the disclosure is not limited thereto.

Referring to FIG. 2D, in some embodiments, the landing region 140 where the encapsulant 22 and the thermal dissipation structure 20 are exposed may also be referred to as a thermal dissipation shroud landing region 140. In some embodiments, a portion of the top surface of the dielectric layer 17 and portions of the top surfaces of the pads 18b are exposed in the region 140.

Figure 2E:
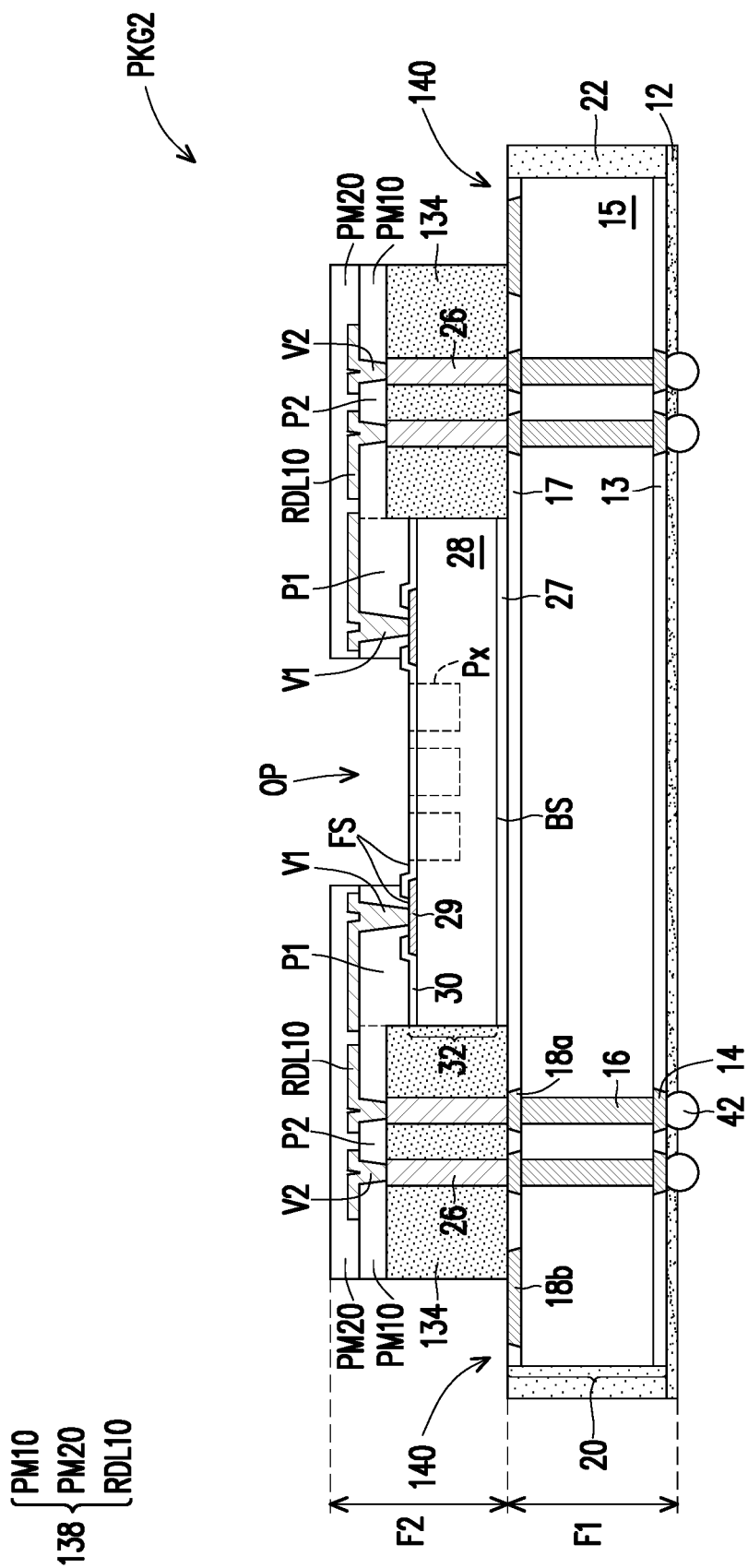

Referring to FIG. 2D and FIG. 2E, processes similar to those described in FIG. 1G to FIG. 1H of the first embodiment are performed. For example, the de-bonding layer 11 is decomposed under the heat of light, and the carrier 10 is released from the overlying structure. Thereafter, connectors 42 are formed penetrating through the adhesive layer 12, so as to electrically connect to the pads 14 of the thermal dissipation structure 20, and further electrically connected to the die 32 through the TIVs 26 and the RDL structure 138.

Referring to FIG. 2E, as such, a package structure PKG2 is thus formed, the package structure PKG2 includes the thermal dissipation structure 20, the encapsulant 22, the die 32, the TIVs 26, the encapsulant 134, the RDL structure 38a and the conductive terminals 42. The package structure PKG2 is similar to the package structure PKG1 (FIG. 1H), except that the forming method of the landing region 140 is different from that of the landing region 40 in the first embodiment. Accordingly, the second floor structure F2 of the package structure PKG2 may have a shape different that of the package structure PKG1. In some embodiments, the second floor structure F2 of the package structure PKG2 may have substantially straight sidewalls. The sidewalls of the polymer layers PM10 and PM20 of the RDL structure 138 may be substantially coplanar with the sidewalls of the encapsulant 134. However, the disclosure is not limited thereto. The sidewalls of the encapsulant 134 may have any suitable shape depending on the shape of the sacrificial brick 100.

Figure 2F:
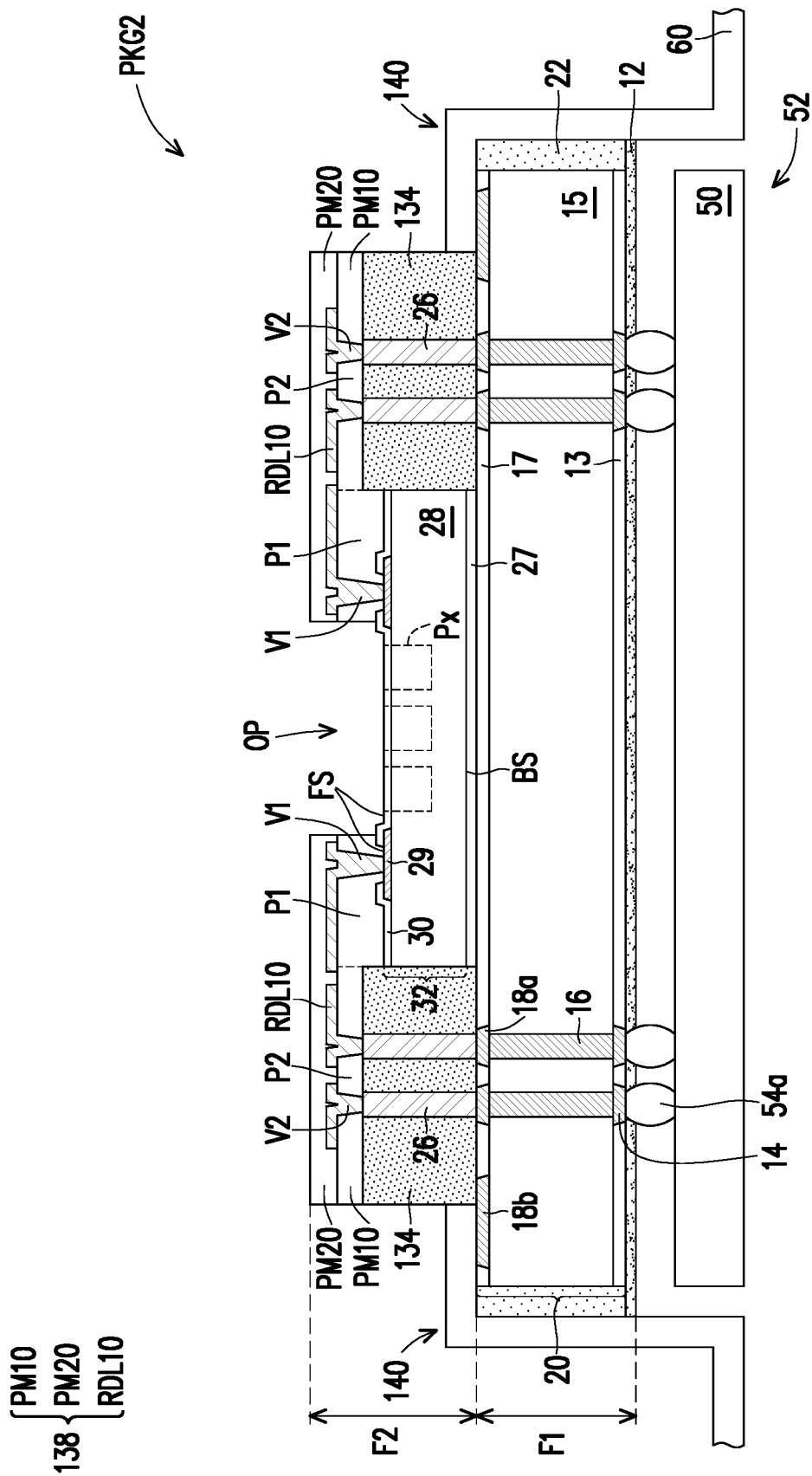

Referring to FIG. 2F, in some embodiments, the package structure PKG2 may further be connected to a PCB 52, and a thermal dissipation shroud 60 may be configured on the package structure PKG2 for thermal dissipation. In some embodiments, the thermal dissipation shroud 60 is landing on the thermal dissipation landing region 140 to be in physical contact with a portion of the top surface of the thermal dissipation structure 20 and the top surface and sidewalls of the encapsulant 22. A portion of the dissipation shroud 60 is laterally aside the encapsulant 134, and may or may not be in physical contact with the sidewalls of the encapsulant 134. A portion of the dissipation shroud 60 is laterally aside the PCB 50, and may or may not be in physical contact with the sidewalls of the PCB 52. The other features of the package structure PKG2 are similar to those of the package structure PKG1, which are not described again.

FIG. 3A to FIG. 3D are schematic cross-sectional views illustrating a method of forming a package structure according to a third embodiment of the disclosure. The third embodiment is similar to the second embodiment, except that the sacrificial brick is replaced by a thermal dissipation brick, and the thermal dissipation brick is remained and included in a package structure PKG3.

Figure 3A:
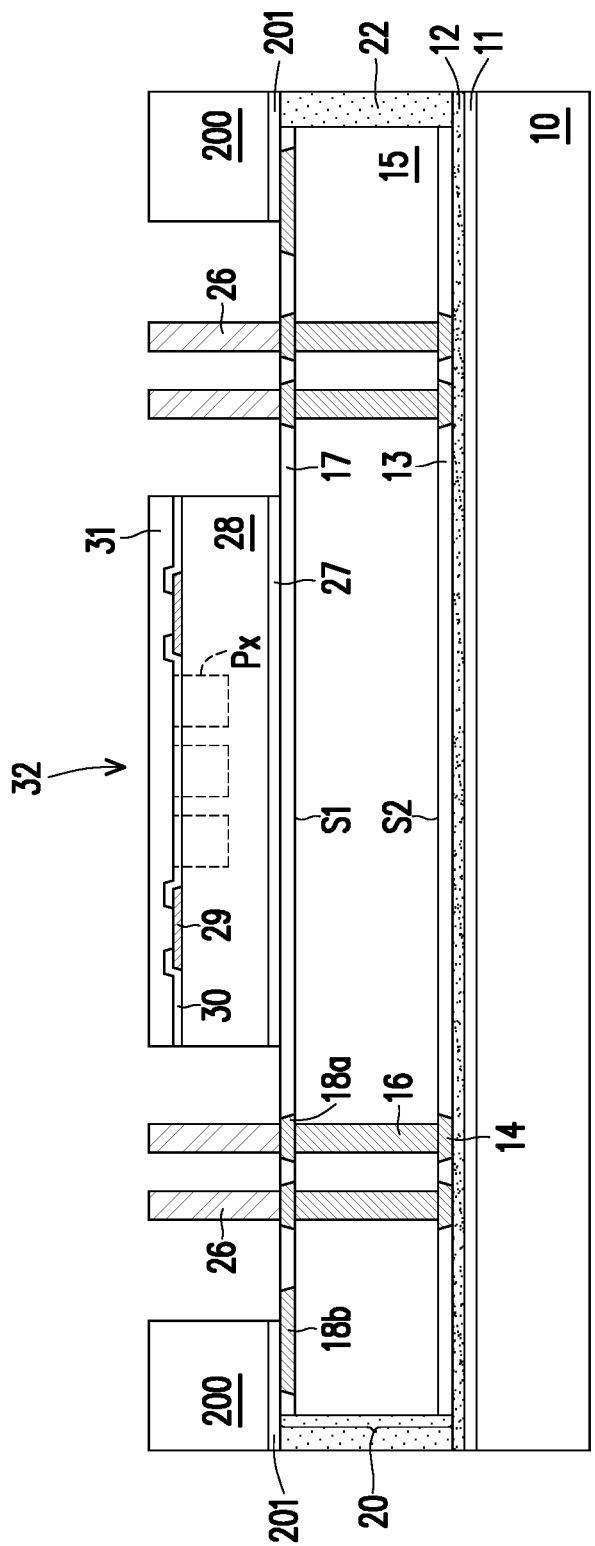
FIG. 3A to FIG. 3E are schematic cross-sectional views illustrating a method of forming a package structure according to a third embodiment of the disclosure.

Referring to FIG. 3A, processes similar to those described in FIG. 2A of the second embodiment are performed, such that the TIVs 26 and the die 32 are disposed over the thermal dissipation structure 20. In some embodiments, a thermal dissipation brick 200 is further disposed on the encapsulant 22 and the thermal dissipation structure 20. The thermal dissipation brick 200 may be disposed at a location the same as that of the sacrificial brick 100. For example, the thermal dissipation brick 200 may be disposed on the edge of the thermal dissipation structure 20 and on the encapsulant 22. In some embodiments, the thermal dissipation brick 200 covers the top surface of the encapsulant 22, a portion of the top surface of the dielectric layer 17 and at least portions of the top surfaces of the pads 18b.

The thermal dissipation brick 200 includes a material having good or excellent thermal dissipation property. In some embodiments, the thermal dissipation brick 200 is a silicon brick. In alternative embodiments, the material of the thermal dissipation brick 200 may be similar to, and may be the same as or different from those of the substrate 15 of the thermal dissipation structure 20. For example, the thermal dissipation brick 200 may include aluminum nitride, silicon nitride, aluminum oxide, the like, or combinations thereof, but the disclosure is not limited thereto. In some embodiments, the thermal dissipation brick 200 is formed by pick and place processes. For example, the thermal dissipation brick 200 may be attached to the thermal dissipation structure 20 and the encapsulant 22 by adhesive layers 201. In some embodiments, the material of the adhesive layer 201 is similar to and may be the same as or different from the material of the adhesive layer 27.

Figure 3B:
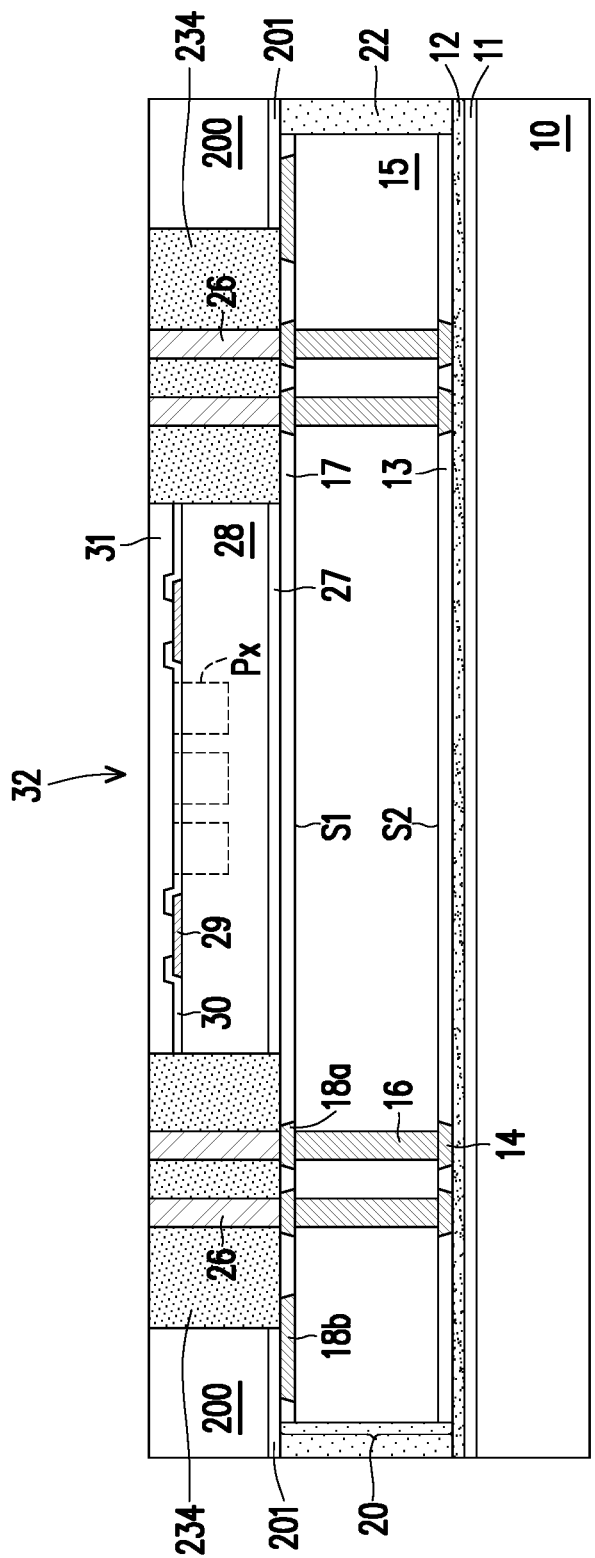

Referring to FIG. 3B, an encapsulant 234 is formed over the thermal dissipation structure 20 to laterally encapsulate sidewalls of the die 32 and sidewalls of the TIVs 26. In some embodiments, the top surface of sacrificial film 31 of the die 32, the top surfaces of the TIVs 26, the top surface of the encapsulant 234 and the top surfaces of the thermal dissipation brick 200 are substantially coplanar with each other.

Figure 3C:
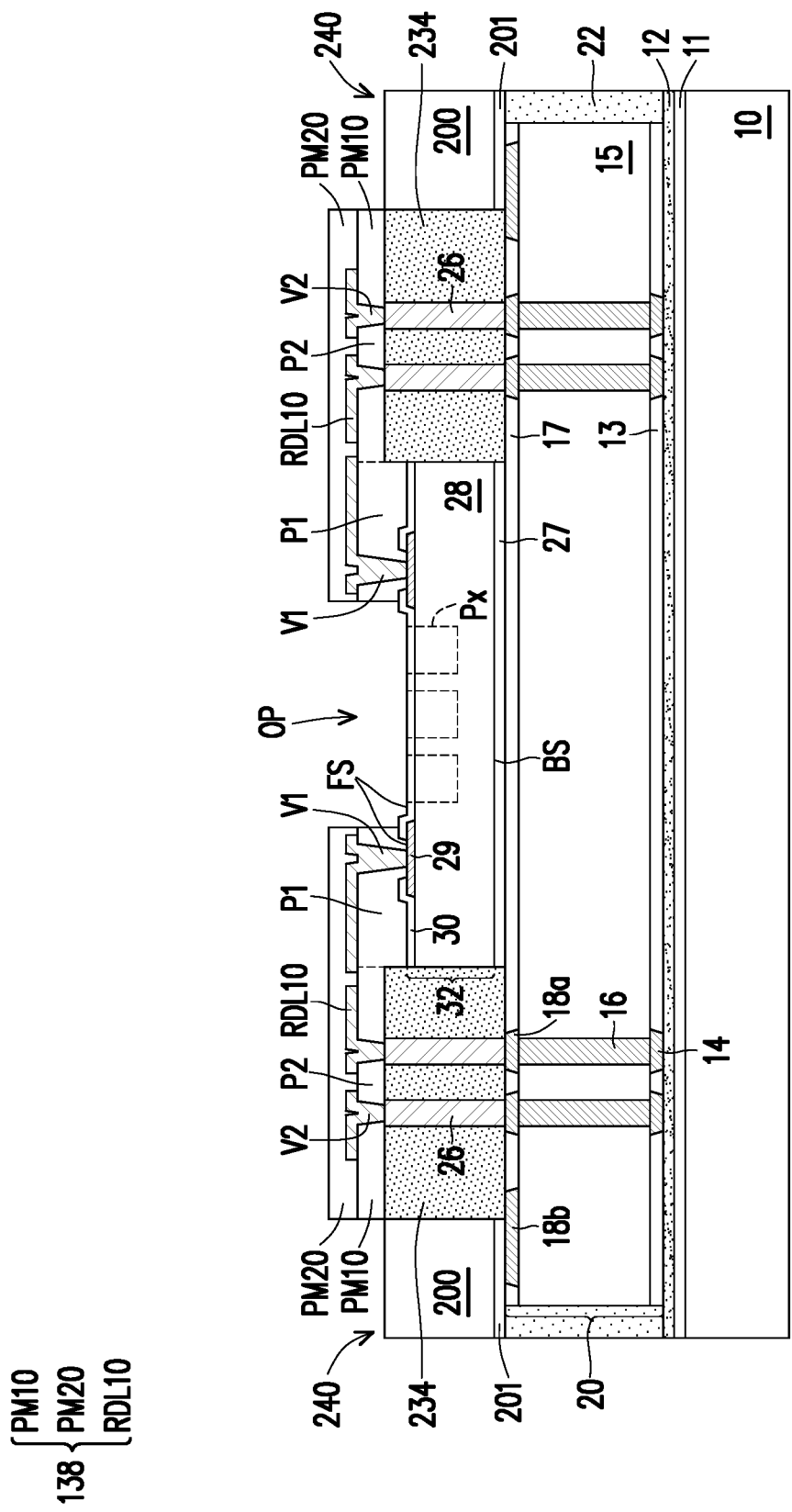

Referring to FIG. 3B and FIG. 3C, the sacrificial film 31 is removed, and a RDL structure 138 is formed over the die 32 and the encapsulant 234 to electrically connect to the die 32 and the TIVs 26. In some embodiments, the RDL structure 138 is not formed on the thermal dissipation brick 200. The top surface of the thermal dissipation brick 200 is exposed for landing a thermal dissipation shroud thereon.

Figure 3D:
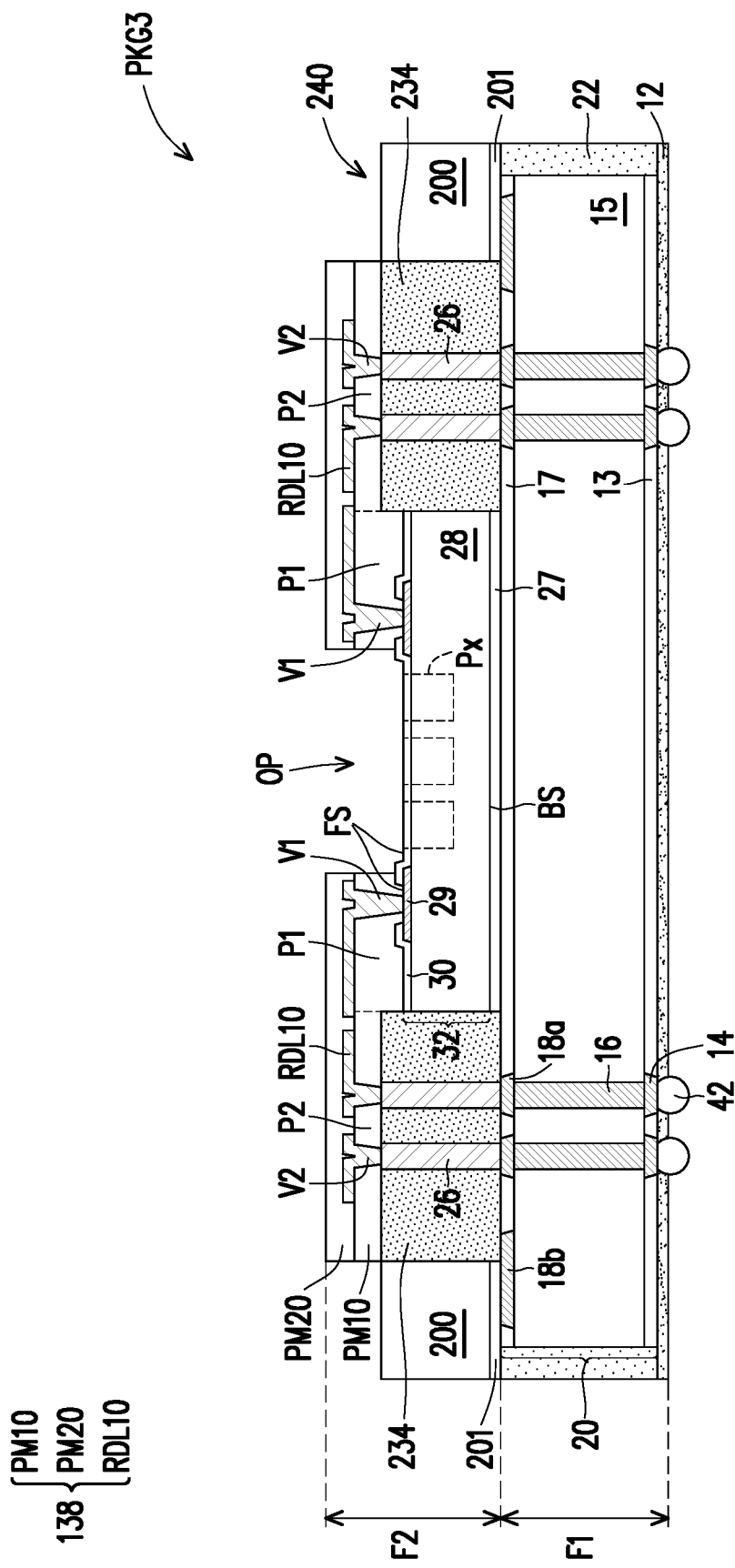

Referring to FIG. 3D, the de-bonding layer 11 is decomposed under the heat of light, and the carrier 10 is then released from the overlying structure. Thereafter, connectors 42 are formed penetrating through the adhesive layer 12 to electrically connect to the pads 14 of the thermal dissipation structure 20.

As such, a package structure PKG3 is thus formed, the package structure PKG3 includes the thermal dissipation structure 20, the encapsulant 22, the die 32, the TIVs 26, the encapsulant 234, the RDL structure 138, the conductive terminals 42 and the thermal dissipation brick 200. The thermal dissipation brick 200 is located on the edge of the first floor structure F1, and laterally aside the encapsulant 234. In some embodiments, the thermal dissipation brick 200 is in physical contact with the sidewalls of the encapsulant 234. The top surface of the thermal dissipation brick 200 may be lower than the top surface of the RDL structure 138. Such a height difference creates a landing region 240 for landing a thermal dissipation shroud thereon. In some embodiments, the landing region 240 may also be referred to as a thermal dissipation shroud landing region.

Figure 3E:
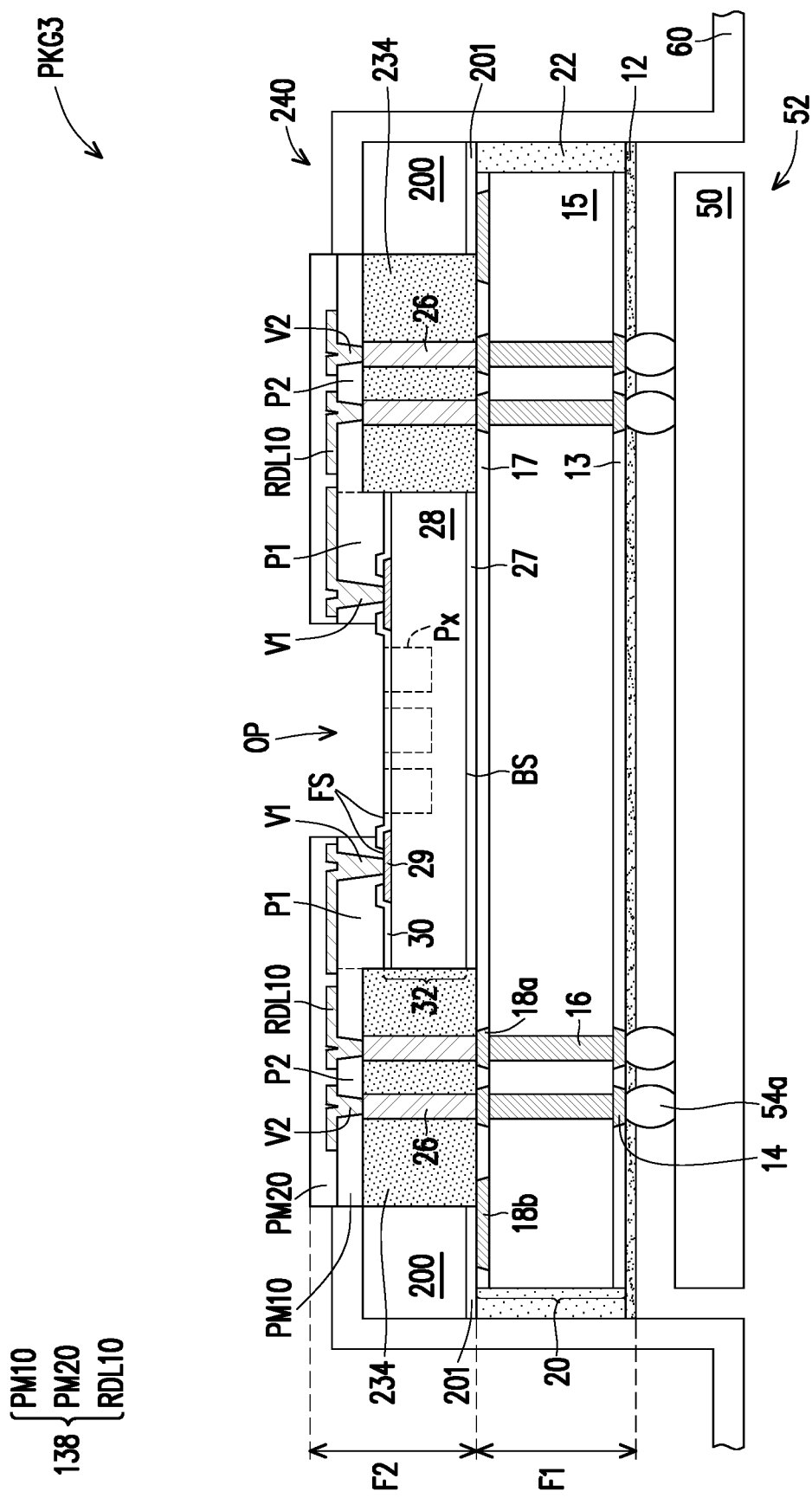

Referring to FIG. 3E, processes similar to those described in FIG. 1J and FIG. 2F may be performed, and the package structure PKG3 may further be coupled to a PCB 52. A thermal dissipation shroud 60 may be configured on the package structure PKG3 for thermal dissipation of the package structure PKG3. In some embodiments, the thermal dissipation shroud 60 may be landing on the thermal dissipation brick 200 and laterally aide the RDL structure 138. In some embodiments, the thermal dissipation shroud 60 is in physical contact with the thermal dissipation brick 200, and may or may not be in physical contact with the sidewalls of the RDL structure 138. The other features of the package structure PKG3 are similar to those of the package structure PKG1 or PKG2, which are not described again.

Figure 4A:
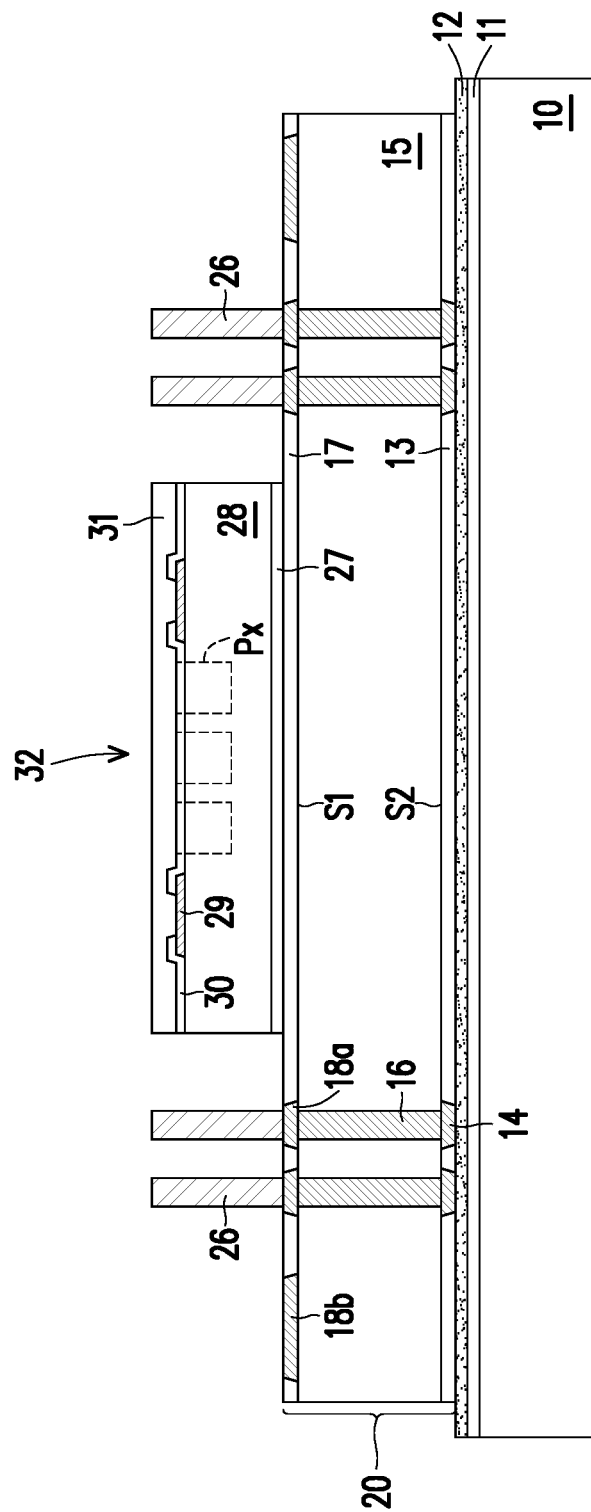
FIG. 4A to FIG. 4C are schematic cross-sectional views illustrating a method of forming a package structure according to a fourth embodiment of the disclosure.
Figure 4B:
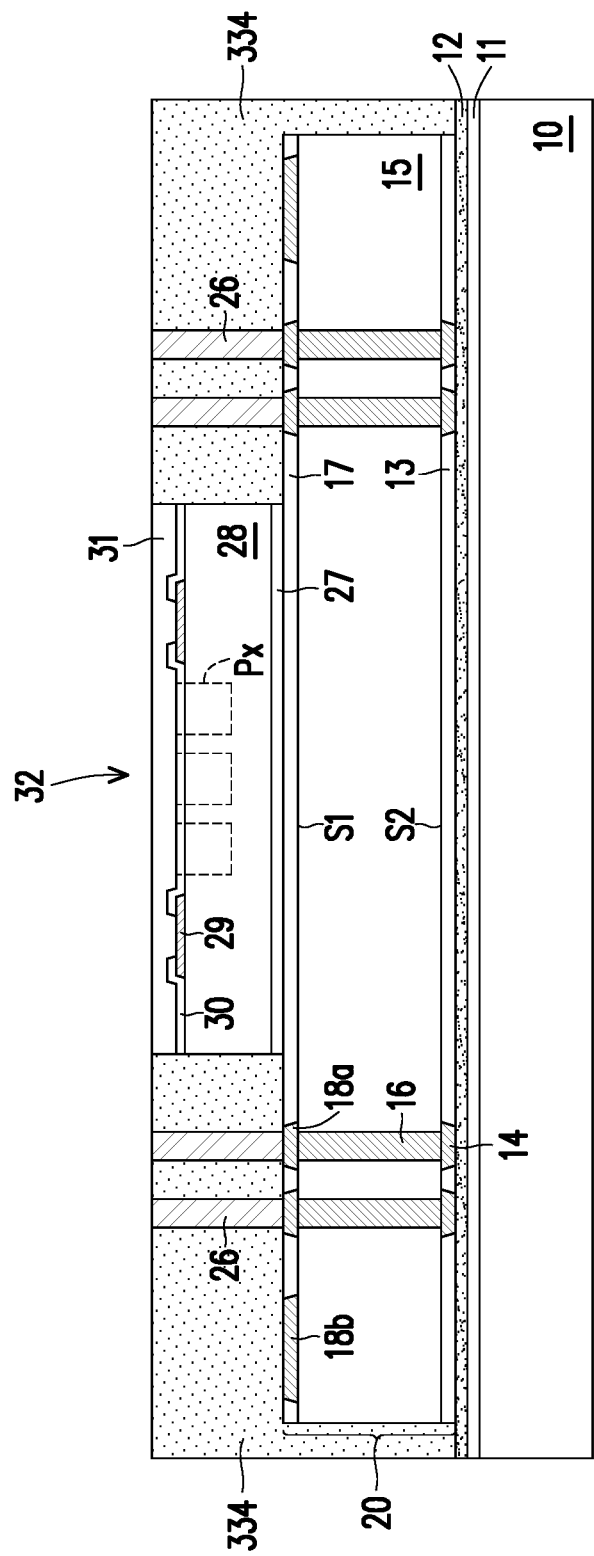
Figure 4C:
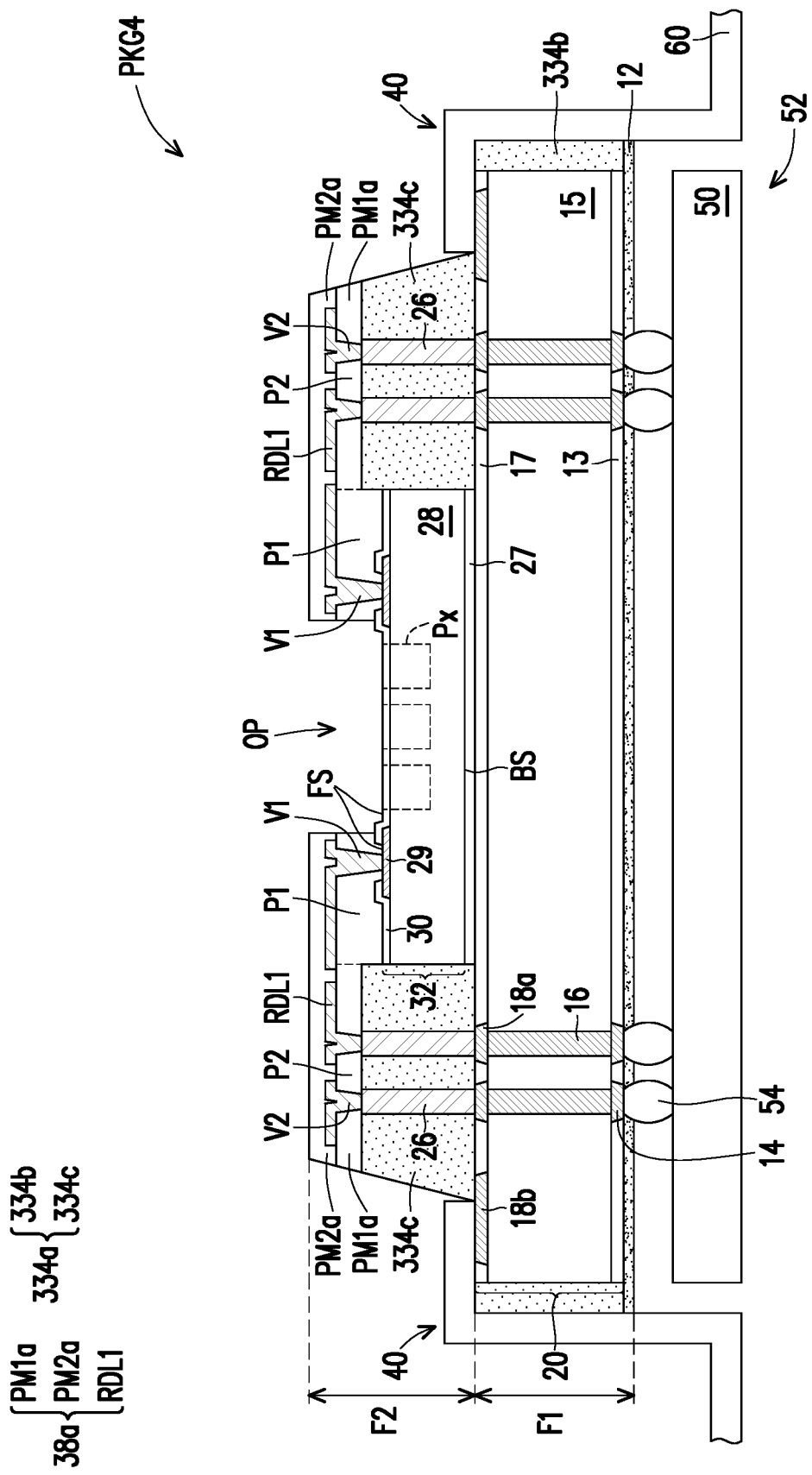

FIG. 4A to FIG. 4C are schematic cross-sectional views illustrating a method of forming a package structure according to a fourth embodiment of the disclosure. The fourth embodiment is similar to the first embodiment, except that the encapsulant aside the thermal dissipation structure and the encapsulant aside the die are formed simultaneously.

Referring to FIG. 4A, in some embodiments, a thermal dissipation structure 20 is disposed over a carrier 10, thereafter, a die 32 and TIVs 26 are disposed on the thermal dissipation structure 20. In some embodiments, encapsulant is not formed aside the thermal dissipation structure 20 before forming the TIVs 26 and mounting the die 32.

Referring to FIG. 4B, an encapsulant 334 is formed over the carrier 10, so as to encapsulate the top surface and sidewalls of the thermal dissipation structure 20, sidewalls of the die 32 and sidewalls of the TIVs 26. The material of the encapsulant 334 is similar to those of the encapsulant 34 or 22 (FIG. 1D), which are not described again. In some embodiments, the encapsulant 334 is formed by forming an encapsulant material layer over the carrier 10 to cover sidewalls and top surfaces of the thermal dissipation structure 20, the die 32 and the TIVs 26, thereafter, a planarization process such as a CMP process is performed to remove a portion of the encapsulant material layer, such that the top surface of the die 32 and the top surfaces of the TIVs 26 are exposed. In some embodiments, the top surface of the encapsulant 334, the top surface of the sacrificial film 31 of the die 32 and the top surfaces of the TIVs 26 are substantially coplanar with each other.

In this embodiment, the encapsulant 334 aside the thermal dissipation structure 20 and the encapsulant 334 aside the die 32 and the TIVs 26 is formed simultaneously, and therefore no interface is formed therebetween, that is, no interface is formed in the encapsulant 334.

Referring to FIG. 4B to FIG. 4C, processes similar to those described in FIG. 1E to FIG. 1J are performed to form a package structure PKG4, and the package structure PKG4 may further be coupled to a PCB 52 through a plurality of connectors 54. Referring to FIG. 4C, in some embodiments, after the removal process of the RDL structure and the encapsulant for creating the landing region, an encapsulant 334a including a first portion 334b and a second portion 334c is remained. The first portion 334b of the encapsulant 334a is laterally aside the thermal dissipation structure 20 to encapsulate sidewalls of the thermal dissipation structure 20. The second portion 334c of the encapsulant 334a is laterally aside the die 32 and the TIVs 26 to encapsulate sidewalls of the die 32 and the TIVs 26. The other features of the package structure PKG4 are similar to those of the package structure PKG1 (FIG. 1H), which are not described again.

Referring to FIG. 1J, FIG. 2F, FIG. 3E and FIG. 4C, in the foregoing embodiments, the adhesive layer 12 is remained in the package structure PKG1/PKG2/PKG3/PKG4. Further, the cross-sectional shape of the PCB 52 is illustrated as rectangular. In some embodiments, the PCB 52 is plate shaped, such as square or rectangular shaped. The top view or bottom view of the PCB 52 may be square or rectangular. However, the disclosure is not limited thereto.

Figure 5A:
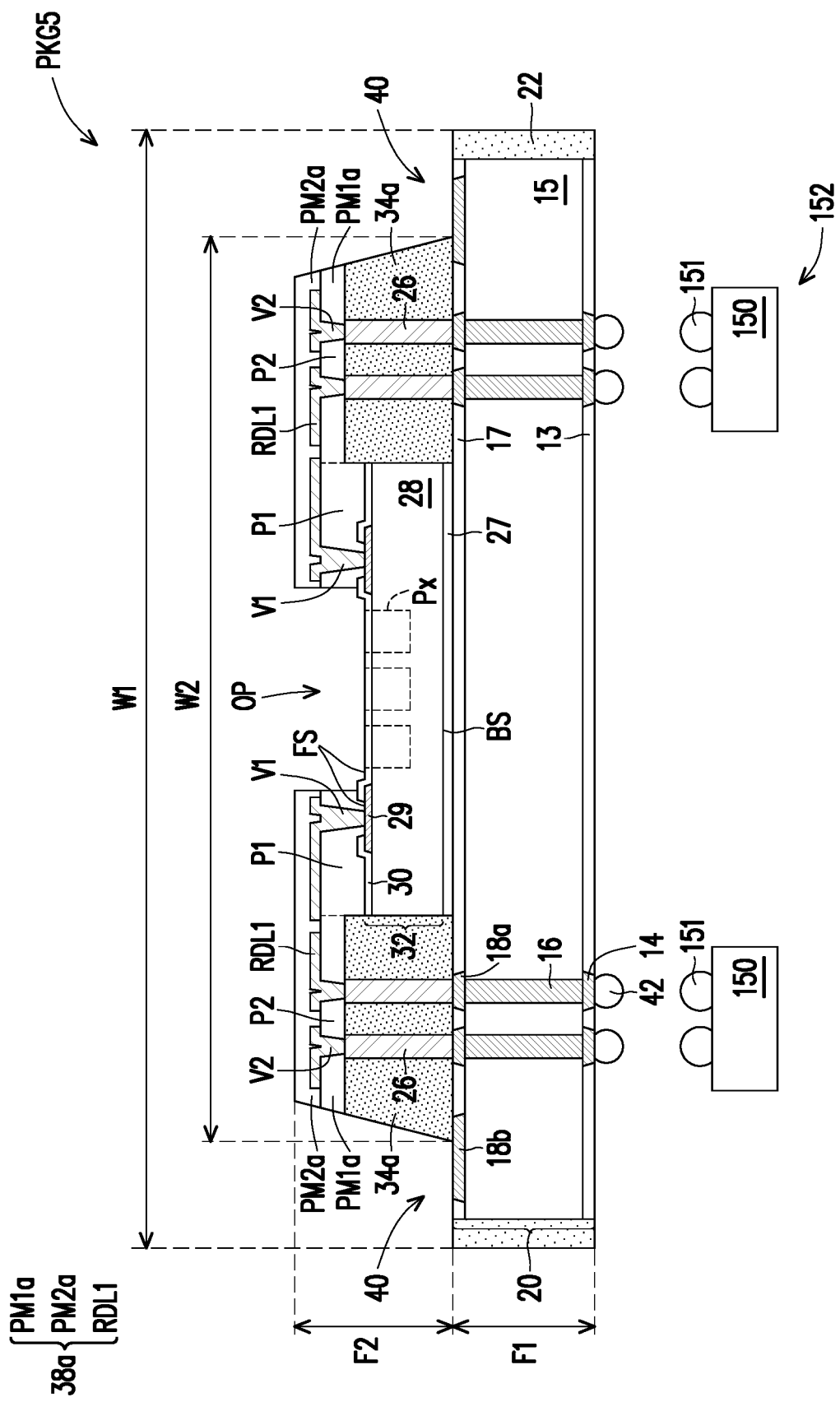
FIG. 5A to FIG. 5B are schematic cross-sectional views illustrating a method of forming a package structure according to alternative embodiments of the disclosure.
Figure 5B:
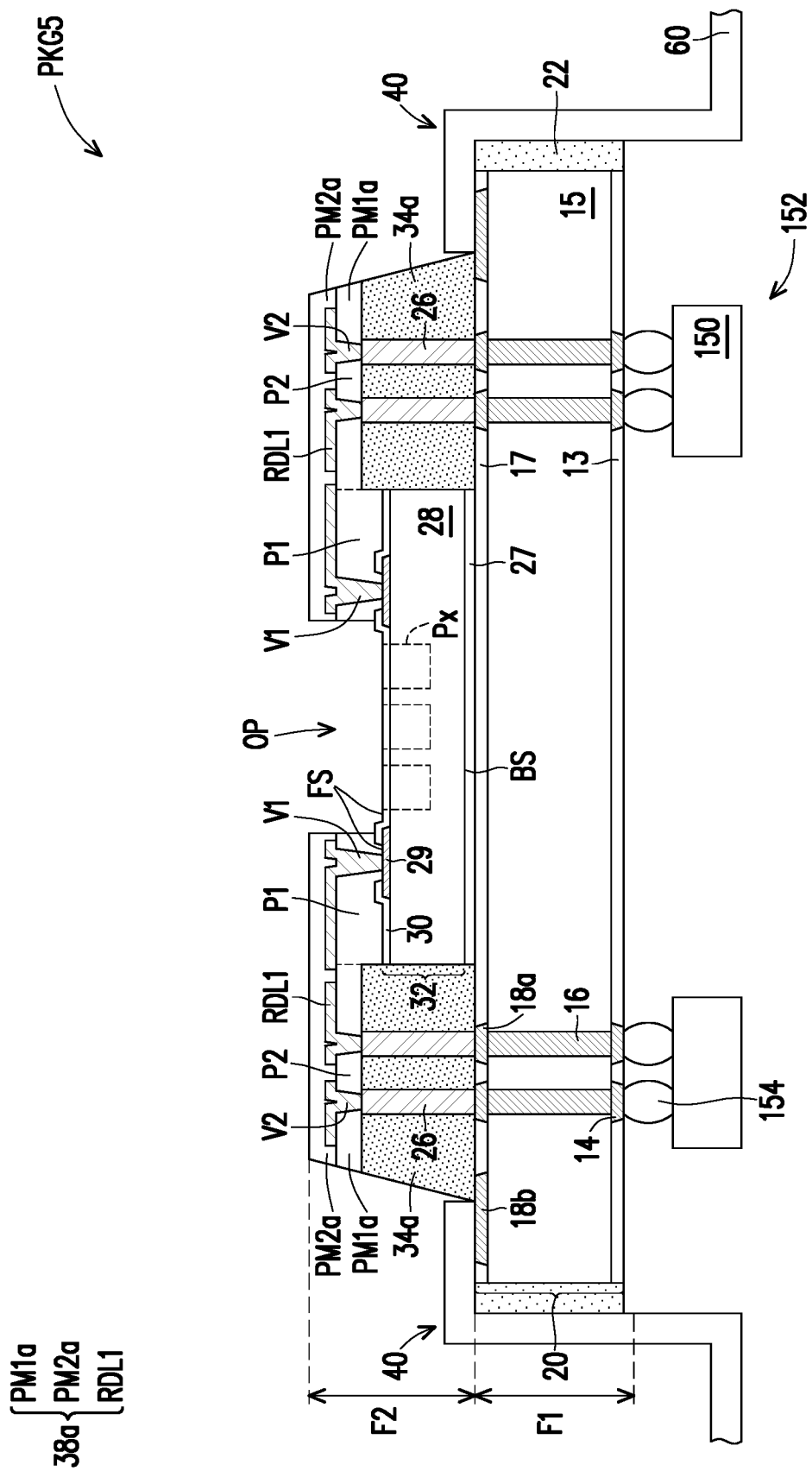
Figure 6:
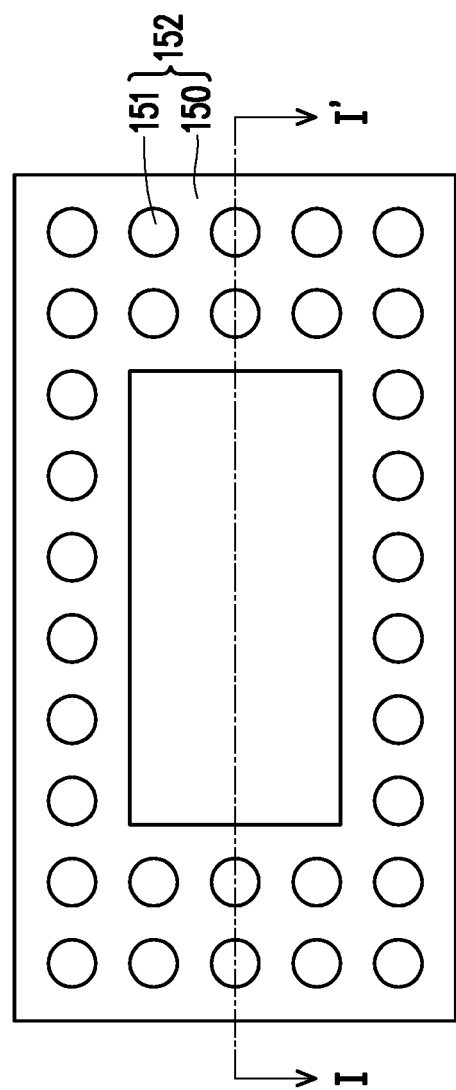
FIG. 6 illustrates a top view of a PCB of FIG. 5B according to some embodiments of the disclosure.

FIG. 5A to FIG. 5B are schematic cross-sectional views illustrating a package structure coupled to a PCB according to some other embodiments of the disclosure. FIG. 6 illustrates a top view of the PCB of FIG. 5A, and FIG. 5A illustrates the cross-sectional view of the PCB along a I-I' line of FIG. 6.

Referring to FIG. 1I and FIG. 5A, in some embodiments, after the carrier 10 is released, the adhesive layer 12 underlying the thermal dissipation structure 20 is removed by an etching process, a cleaning process, for example. The bottom surface of the encapsulant 22 and the bottom surface of the thermal dissipation structure 20 are exposed, and the connectors 142 are formed on and electrically connected to the pads 14 of the thermal dissipation structure 20. As such, a package structure PKG5 is formed. The package structure PKG5 is similar to package structure PKG1, except that the package structure PKG5 is free of the adhesive layer 12.

Referring to FIG. 1I, FIG. 5A and FIG. 6, a PCB 152 is provided, the PCB 152 includes a body structure 150 and a plurality of connectors 151 thereon. In some embodiments, the PCB 152 has a hollow structure. For example, the PCB 152 is ring-shaped.

Referring to FIG. 5B, thereafter, processes similar to FIG. 1I to FIG. 1J are performed to connect the package structure PKG5 to the PCB 152. For example, a reflow process is performed, and the connectors 142 are fused with the corresponding connectors 151 to form the connectors 154, such that the package structure PKG5 is electrically connected to the PCB 152 through the connectors 154.

In this embodiment, since the adhesive layer is removed, and the PCB is configured as ring-shaped, a better thermal dissipation performance of the package structure is achieved.

Figure 7:
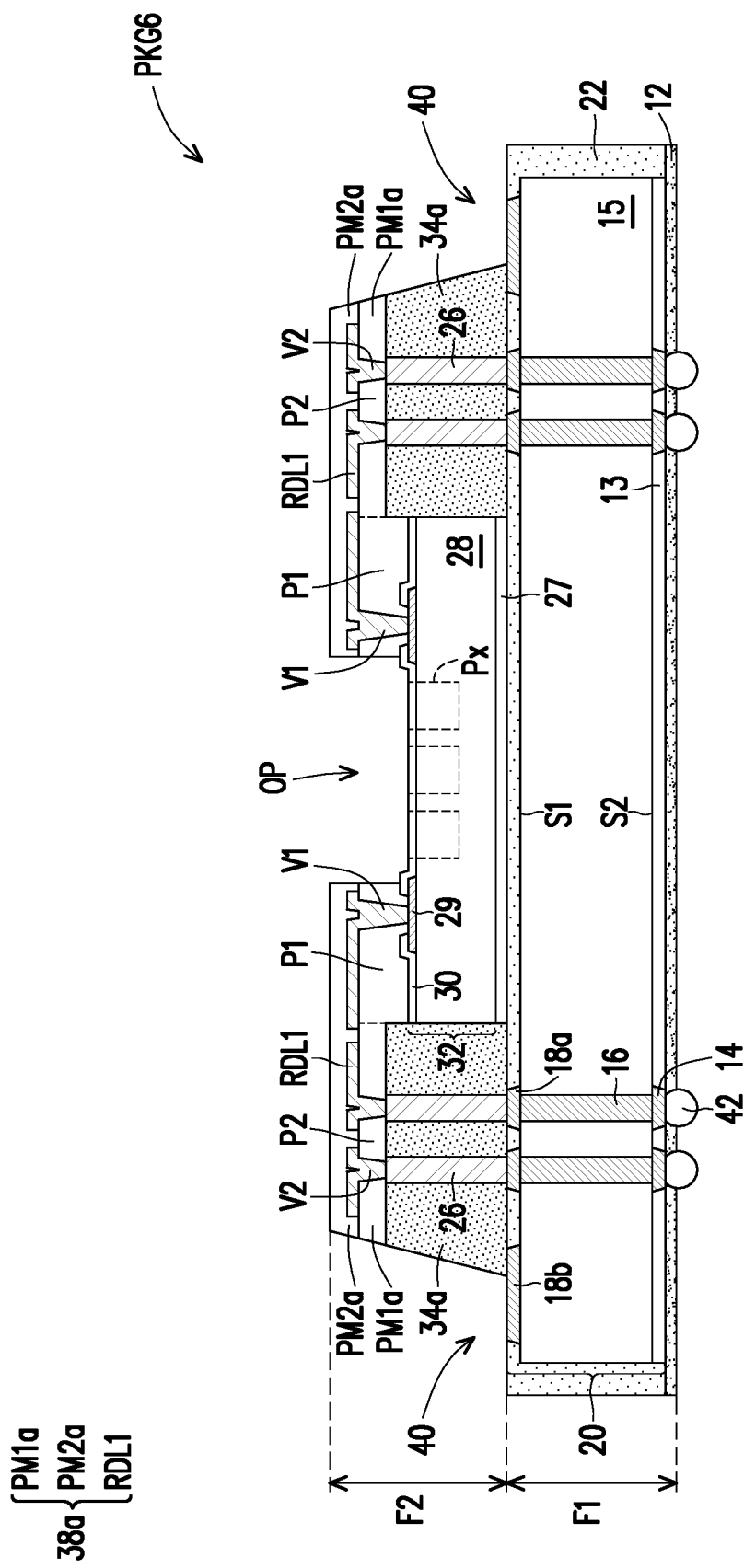
FIG. 7 and FIG. 8 illustrate a package structure according to some embodiments of the disclosure, respectively.
Figure 8:
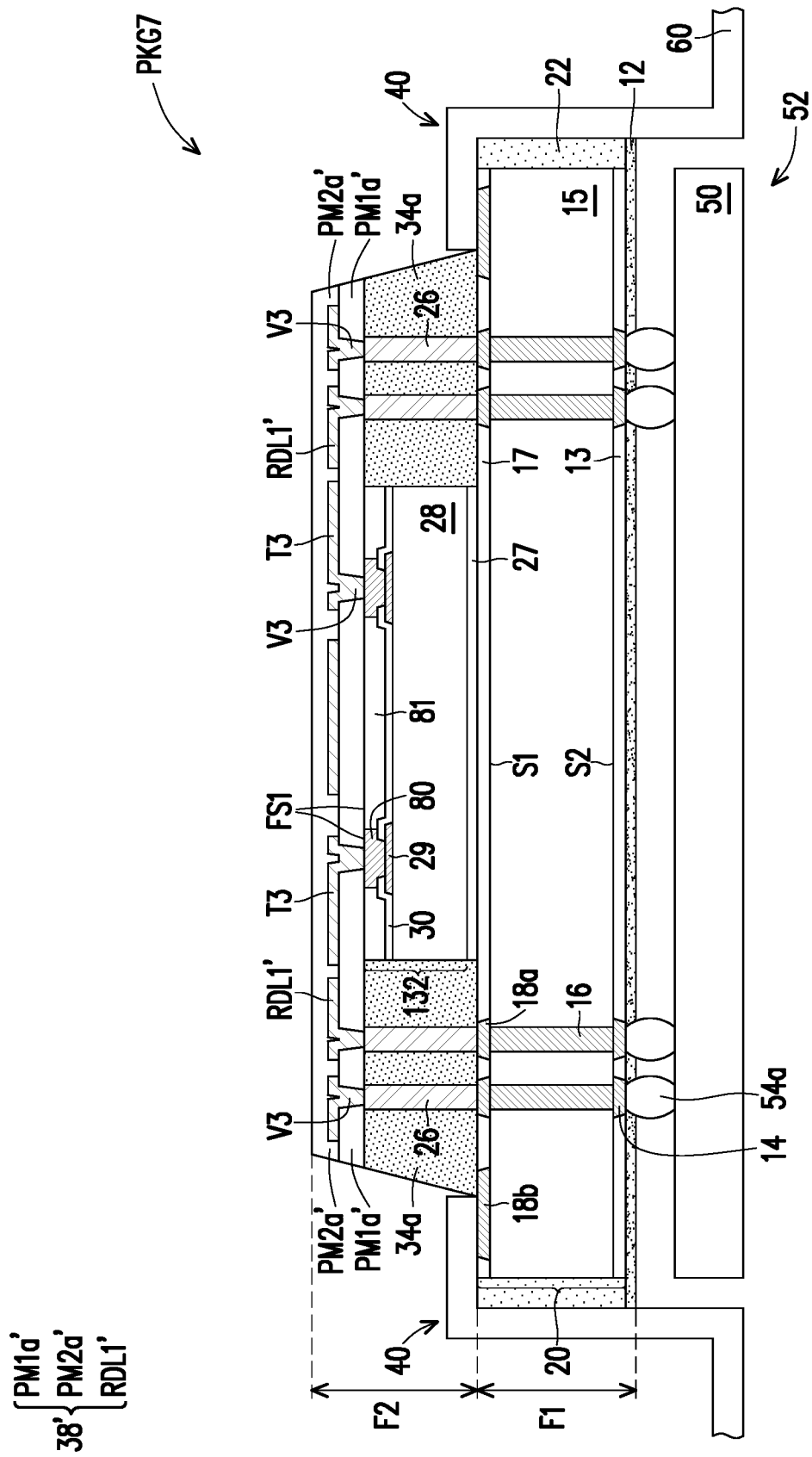

FIG. 7 and FIG. 8 are schematic cross-sectional views respectively illustrating a package structure according to some other embodiments of the disclosure.

Referring to FIG. 7, a package structure PKG6 is illustrated. The package structure PKG6 is similar to the package structure PKG1, except that the thermal dissipation structure 20 is free of a dielectric layer on the first surface S1 of the substrate 15, and the encapsulant 22 is further formed on the first surface S1 of the substrate 15 and laterally encapsulating sidewalls of the pads 18a and 18b of the thermal dissipation structure 20. The top surface of the encapsulant 22 is substantially coplanar with the top surfaces of the pads 18a and 18b of the thermal dissipation structure 20. As shown in FIG. 7, the encapsulant 22 is in physical contact with the adhesive layer 27 and the encapsulant 34a. An interface is existed between the encapsulant 22 and the encapsulant 34a, similar to those described in the first embodiment. The package structure PKG6 may further be coupled to a PCB, and a thermal dissipation shroud may further be landing on the package structure PKG6, similar to those descried in FIG. 1J.

In the foregoing embodiments, the RDL structure is illustrated as having an opening for better signal reception and transmission. However, the disclosure is not limited thereto. In some embodiments, the die may be not exposed by the RDL structure. The configuration of the RDL structure may be adjusted depending on the type of the die. It is noted that, the embodiments of disclosure may be applied to any kind of package structure including any kind of die which requires good thermal dissipation performance and warpage control ability.

Referring to FIG. 8, a package structure PKG7 is illustrated, in some embodiments, a die 132 includes a substrate 28, a plurality of pads 29, a passivation layer 30 and further includes a plurality of connectors 80 and a passivation layer 81. The connectors 80 are formed on and electrically connected to the pads 29 not covered by the passivation layer 30. The connector 80 includes gold bumps, copper bumps, copper posts, copper pillars, or the like. The passivation layer 81 is formed over the passivation layer 30 and laterally aside the connectors 80. The top surface of the passivation layer 81 and the top surfaces of the connectors 80 are substantially coplanar with each other and constitute a front surface FS1 of the die 132. In some embodiments, the top surface of the encapsulant 34a is substantially coplanar with the front surface FS1 of the die 132.

A RDL structure 38' is formed on the die 132 and the encapsulant 34a. In some embodiments, the die 132 is not exposed by the RDL structure 38', and may be completely covered by the RDL structure 38'. The RDL structure 38' includes polymer layers PM1a', PM2a' and a redistribution layer RDL1a'. In some embodiments, the polymer layer PM1a' has a substantially uniform thickness extending on the die 32 and the encapsulant 34a. The redistribution layer RDL1' include the vias V3 and traces T3 connected to each other. The vias V3 penetrates through the polymer layer PM1a' to connect the traces T3 to the connectors 80 and the TIVs 26. The traces T3 are extending on the top surface of the polymer layer PM1a'. In this embodiment, the vias V3 connected to the connectors 80 and the vias V3 connected to the TIVs 26 may have substantially the same height. In some embodiments, the package structure PKG7 may further be coupled to a PCB 52, and a thermal dissipation shroud 60 may further be landing on the package structure PKG7, similar to those descried in FIG. 1J.

In the embodiment of the disclosure, a thermal dissipation structure is integrated in a package structure, and the package structure includes a region for landing a thermal dissipation shroud thereon. In some embodiments, the package structure further includes a thermal dissipation brick on the thermal dissipation structure. As such, the package structure has a very excellent thermal dissipation performance, and the die (chip) included in the package structure may be maintained at a suitable operation temperature. Therefore, some issues (such as shut down) may be caused by high temperature are avoided. In addition, the thermal dissipation structure also provides a sufficient degree of rigidity to avoid or reduce the warpage of the package structure. Further, since the thermal dissipation structure has been integrated in InFO package, additional SMT process for mounting the thermal dissipation structure to the package structure is not needed, and thus has the advantage of cost down, and some issues may be caused by the additional SMT process are avoided.

In accordance with some embodiments of the disclosure, a package structure includes a die, a TIV, a first encapsulant, a RDL structure, a thermal dissipation structure and a second encapsulant. The die has a first surface and a second surface opposite to each other. The TIV is laterally aside the die. The first encapsulant encapsulates sidewalls of the die and sidewalls of the TIV. The RDL structure is disposed on the first surface of the die and on the first encapsulant, electrically connected to the die and the TIV. The thermal dissipation structure is disposed over the second surface of die and electrically connected to the die through the TIV and the RDL structure. The second encapsulant encapsulates sidewalls of the thermal dissipation structure.

In accordance with alternative embodiments, a package structure includes a die, a TIV, a first encapsulant, a RDL structure and a thermal dissipation structure. The TIV is laterally aside the die. The first encapsulant encapsulates sidewalls of the die and sidewalls of the TIV. The RDL structure is electrically connected to the die and the TIV. The thermal dissipation structure is electrically connected to the die through the TIV and the RDL structure. The thermal dissipation structure comprises a first portion in physical contact with the first encapsulant and a second portion laterally protruding from a sidewall of the first encapsulant.

In accordance with some embodiments of the disclosure, a method of forming a package structure includes the following processes. A die is mounted to a thermal dissipation structure. A TIV is laterally aside the die and electrically connected to the thermal dissipation structure. A first encapsulant is formed to laterally encapsulate sidewalls of the TIV and sidewalls of the die. A RDL structure is formed over the die and the first encapsulant. The RDL structure is electrically connected to the die and the TIV. The die is electrically connected to the thermal dissipation structure through the RDL structure and the TIV.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a thermal dissipation structure comprising a substrate;
   a first encapsulant laterally covering the substrate;
   a die disposed on the substrate and comprising a sensing region;
   a second encapsulant laterally covering the die, an outer sidewall of the second encapsulant being laterally offset from an outer sidewall of the first encapsulant; and
   a redistribution structure disposed on the die and the second encapsulant, the die being electrically coupled to the substrate through the redistribution structure, the redistribution structure comprising a hollow region overlying the sensing region of the die.

2. The package structure of claim 1, wherein the outer sidewall of the second encapsulant is directly over the substrate.

3. The package structure of claim 1, wherein a back side of the die is attached to the substrate through an adhesive layer.

4. The package structure of claim 1, wherein the die further comprises an active surface on which a contact pad is disposed, and the active surface is between a top surface of the second encapsulant and a bottom surface of the second encapsulant.

5. The package structure of claim 1, further comprising:
   a through integrated fan-out via (TIV) penetrating through the second encapsulant and connected to the redistribution structure and the substrate.

6. The package structure of claim 5, wherein the TIV comprises an end directly landing on a first conductive pad of the substrate.

7. The package structure of claim 1, wherein the outer sidewall of the second encapsulant is directly over a second conductive pad of the substrate.

8. The package structure of claim 1, wherein the thermal dissipation structure further comprises a thermal dissipation shroud, a vertical portion of the thermal dissipation shroud is abutted against the outer sidewall of the first encapsulant.

9. The package structure of claim 8, wherein the vertical portion of the thermal dissipation shroud extends beyond the first encapsulant and away from a lower surface of the first encapsulant which is connected to the outer sidewall of the first encapsulant.

10. The package structure of claim 1, wherein the substrate comprises a first conductive pad, a through substrate via connected to the first conductive pad, and a second pad on a periphery of the substrate and wider than the first pad.

11. A package structure, comprising:
a thermal dissipation structure comprising a substrate;
a lower encapsulant extending along a sidewall of the substrate;
a die disposed on the substrate, the die comprising an active surface and a sensing region on the active surface;
an upper encapsulant extending along a sidewall of the die, the upper encapsulant comprises a top surface and a bottom surface, the active surface of the die being between the top and bottom surfaces of the upper encapsulant; and
a redistribution structure disposed on the top surface of the upper encapsulant and revealing the sensing region of the die, the redistribution structure being electrically coupled to the active surface of the die.

12. The package structure of claim 11, wherein the redistribution structure comprising a conductive pattern electrically connected to the die and physically contacting the active surface of the die, and the conductive pattern is laterally offset from the sensing region of the die.

13. The package structure of claim 11, further comprising:
an adhesive layer extending across lower sides of the substrate and the lower encapsulant, wherein the upper encapsulant and the die are disposed on an upper side of the substrate opposite to the lower side.

14. The package structure of claim 11, wherein the thermal dissipation structure further comprises a thermal dissipation shroud laterally surrounding the upper encapsulant and the lower encapsulant.

15. The package structure of claim 11, wherein an outer sidewall of the upper encapsulant is directly above the substrate.

16. The package structure of claim 11, wherein the substrate comprises a first conductive pad, a through substrate via connected to the first conductive pad, and a second pad on a periphery of the substrate.

17. The package structure of claim 16, wherein the upper encapsulant partially landing on the second pad of the substrate.

18. A package structure, comprising:
a thermal dissipation structure comprising a substrate;
a lower encapsulant covering a sidewall of the substrate;
a die disposed on the substrate, the die comprising a sensing region and a contact pad disposed between a sidewall of the die and the sensing region;
an upper encapsulant disposed on and partially covering the substrate, the upper encapsulant covering the sidewall of the die and being higher than the die relative to the substrate; and
a redistribution structure disposed on the upper encapsulant and revealing the sensing region of the die, the redistribution structure comprising a first conductive via landing on the contact pad, the die being electrically coupled to the substrate through the redistribution structure.

19. The package structure of claim 18, wherein the substrate comprises a conductive pad in partial and direct contact with the upper encapsulant.

20. The package structure of claim 18, further comprising:
a through integrated fan-out via (TIV) penetrating through the upper encapsulant and connected to the redistribution structure and the substrate, wherein a second conductive via of the redistribution structure lands on the TIV, and the first conductive via of the redistribution structure extends further than the second conductive via.

* * * * *